United States Patent
Oh

(10) Patent No.: US 10,833,116 B2
(45) Date of Patent: Nov. 10, 2020

(54) IMAGE SENSOR HAVING PD BIAS PATTERNS

(71) Applicant: SK hynix Inc., Icheon-si (KR)

(72) Inventor: Sun-Ho Oh, Icheon-si (KR)

(73) Assignee: SK hynix Inc., Icheon-si (KR)

(*) Notice: Subject to any disclaimer, the term of this patent is extended or adjusted under 35 U.S.C. 154(b) by 0 days.

(21) Appl. No.: 16/219,151

(22) Filed: Dec. 13, 2018

(65) Prior Publication Data
US 2019/0296060 A1    Sep. 26, 2019

(30) Foreign Application Priority Data

Mar. 21, 2018    (KR) .................. 10-2018-0032551

(51) Int. Cl.
*H01L 27/146*    (2006.01)
*H04N 5/355*    (2011.01)
*H04N 5/378*    (2011.01)

(52) U.S. Cl.
CPC .... *H01L 27/1463* (2013.01); *H01L 27/14607* (2013.01); *H01L 27/14612* (2013.01); *H01L 27/14645* (2013.01); *H04N 5/3559* (2013.01); *H04N 5/378* (2013.01)

(58) Field of Classification Search
CPC ... H01L 27/14; H01L 27/146; H01L 27/1463; H01L 27/14607; H01L 27/14612; H01L 27/14614; H01L 27/14641; H01L 27/14645
USPC ....................................... 257/291
See application file for complete search history.

(56) References Cited

U.S. PATENT DOCUMENTS

| | | | |
|---|---|---|---|
| 7,855,407 B2 | 12/2010 | Shim | |
| 8,785,993 B2 | 7/2014 | Abe | |
| 9,496,304 B2 | 11/2016 | Hu et al. | |
| 2014/0291481 A1* | 10/2014 | Zhang | H04N 5/361 250/208.1 |
| 2015/0236058 A1* | 8/2015 | Hu | H01L 27/14607 250/208.1 |
| 2015/0340391 A1* | 11/2015 | Webster | H01L 27/14605 348/322 |
| 2016/0218138 A1* | 7/2016 | Oishi | H01L 27/14643 |
| 2018/0130834 A1* | 5/2018 | Lee | H01L 27/14683 |
| 2018/0175091 A1* | 6/2018 | Jeon | H04N 5/37457 |
| 2018/0301509 A1* | 10/2018 | Ishii | H01L 27/14627 |
| 2019/0115388 A1* | 4/2019 | Jung | H01L 27/1464 |
| 2019/0148448 A1* | 5/2019 | Lee | H01L 27/14612 257/431 |
| 2019/0165018 A1* | 5/2019 | Park | H01L 27/14689 |
| 2019/0378864 A1* | 12/2019 | Innocent | H01L 27/14605 |

FOREIGN PATENT DOCUMENTS

KR    10-2014-0006370 A    1/2014

* cited by examiner

*Primary Examiner* — Fazli Erdem
(74) *Attorney, Agent, or Firm* — Perkins Coie LLP

(57) ABSTRACT

An image sensor may include a photosensing region in a substrate and configured to generate photoelectrons in response to an incident light on the photodiode region, conductive bias patterns disposed to be spaced apart from one another and surrounding the photosensing region, and pixel isolation patterns that are spaced apart from and disposed in a periphery of the conductive bias patterns.

20 Claims, 20 Drawing Sheets

IMAGE SENSOR HAVING PD BIAS PATTERNS

CROSS-REFERENCE TO RELATED APPLICATIONS

This patent document claims priority of Korean Patent Application No. 10-2018-0032551, filed on Mar. 21, 2018, which is incorporated herein by reference in its entirety.

TECHNICAL FIELD

The technology and implementations disclosed in this patent document generally relate to an image sensor having photodiodes (PD) bias patterns, and more particularly, to an electronic device including the image sensor.

BACKGROUND

Due to recent advancement of information communication industry and digitalization of electronic devices, image sensors with improved performance are being used in various fields such as digital cameras, camcorders, mobile phones, Personal Communication Systems (PCS), game machines, security cameras, and medical micro cameras. Generally, an image sensor includes a pixel area including a photodiode and a peripheral circuit area. A unit pixel includes a photodiode and a transfer transistor. As the resolution of the image sensors increases and the size of unit pixels becomes smaller, there has been a need to reduce the physical volume of the photodiode. Accordingly, the capability for generating photoelectron in the photodiode becomes important.

SUMMARY

This patent document provides, among others, designs of image sensors that include photodiode (PD) bias patterns.

Embodiments of the disclosed technology are directed to an image sensor capable of receiving all the light in four colors through one photodiode.

Embodiments of the disclosed technology are directed to an image sensor having pixel isolation patterns capable of blocking a photoelectron leakage path.

In accordance with an embodiment of the disclosed technology, an image sensor may include a photosensing region in a substrate and configured to generate photoelectrons in response to an incident light on the photodiode region; conductive bias patterns disposed to be spaced apart from one another and surrounding the photosensing region; and pixel isolation patterns that are spaced apart from and disposed in a periphery of the conductive bias patterns. In another aspect, an image sensor is provided to comprise: a photodiode region in a substrate; conductive first to fourth PD bias patterns that are radially disposed to be spaced apart from each other and surround the photodiode region; and pixel isolation patterns that are spaced apart from the first to fourth PD bias patterns and surround the first to fourth PD bias patterns.

In some implementations, the conductive bias patterns include four conductive patterns which are disposed on first to fourth quadrants of a pixel unit, respectively, and have an elbow shape in a top view. In some implementations, the conductive bias patterns include: a lining insulating layer which is formed on inner walls of trenches formed in the substrate, and a conductor which fills the trenches over the lining insulating layer. In some implementations, each of the conductive bias patterns includes a pad region to which a voltage is applied. In some implementations, the pixel isolation patterns are formed in a shape of a partition wall extending from a bottom surface of the substrate toward an upper surface of the substrate. In some implementations, the pixel isolation patterns include vertical lines and horizontal lines that are orthogonal to each other in a top view, and the pixel isolation patterns are disposed in a mesh form that the vertical lines and the horizontal lines are connected. In some implementations, the image sensor further comprises: a floating diffusion region disposed in a center of the photosensing region; a floating diffusion isolation region configured to surround the floating diffusion region; and transfer gates that vertically overlap with portions of the floating diffusion region and the floating diffusion isolation region and structured to be operable to transfer photoelectrons generated in the photosensing region out of the photosensing region. In some implementations, the image sensor further comprises: grid patterns vertically overlapping with a central portion of the photosensing region and the pixel isolation patterns and providing cell spaces in a unit pixel provided by the pixel isolation patterns. In some implementations, the image sensor further comprises: shutter patterns disposed to correspond to the conductive bias patterns, respectively; and color filters disposed over the shutter patterns, respectively, and wherein the shutter patterns and the color filters are disposed in the cell spaces, respectively. In some implementations, the shutter patterns are turned on or off to transmit light.

In another aspect, an image sensor is provided to include a plurality of unit pixels that are disposed in rows and columns. Each of the unit pixels may include a single photodiode region formed in a substrate; first to fourth photodiode (PD) bias patterns that are formed in the substrate to be spaced apart from one another, the first to fourth PD bias patterns disposed on virtual first to fourth quadrants of a corresponding pixel unit to surround the single photodiode region and including a conductive material; and grid patterns formed on a first side of the substrate to divide the single photodiode region into first to fourth cell spaces over the virtual first to fourth quadrants, the gird grid patterns having a mesh shape with horizontal portions and vertical portions. In another aspect, an image sensor is provided to include a plurality of unit pixels that are arrayed in a form of matrix, wherein each of the unit pixels includes: one photodiode region formed in a substrate; conductive first to fourth photodiode (PD) bias patterns that are radially formed in the substrate to be spaced apart from each other on virtual first to fourth quadrants to surround the one photodiode region; and grid patterns formed in a mesh shape on a first side of the substrate to divide the one photodiode region into first to fourth cell spaces over the virtual first to fourth quadrants.

In some implementations, the image sensor further comprises: pixel isolation patterns that are formed in the substrate and spaces between the unit pixels, the pixel isolation patterns surrounding the single photodiode region. In some implementations, the pixel isolation patterns are formed in a shape of a partition wall extending from a second side of the substrate into an inside of the substrate. In some implementations, the image sensor further comprises: a floating diffusion region disposed in a center of the single photodiode region; a floating diffusion isolation region configured to surround the floating diffusion region; and first to fourth transfer gates that partially overlap with a portion of the floating diffusion region and disposed on the first to fourth quadrants, wherein the first to fourth transfer gates are disposed over the single photodiode region. In some implementations, the first to fourth PD bias patterns include: a lining insulating layer which is formed on inner walls of trenches extending from an upper side of the substrate into inside of the substrate, and a conductor which fills the trenches over the lining insulating layer. In some implementations, the first to fourth PD bias patterns include first to fourth pad regions, respectively, the first to fourth pad regions contacting a contact plug. In some implementations, the image sensor further comprises: grid patterns vertically overlapping with a central portion of the photodiode region and the pixel isolation patterns and providing first to fourth cell spaces in each unit pixel provided by the pixel isolation patterns surrounding the single photodiode region. In some implementations, the image sensor further comprises: first to fourth shutter patterns disposed to correspond to the first to fourth PD bias patterns, respectively; and first to fourth color filters disposed over the first to fourth shutter patterns, respectively, and wherein the first to fourth shutter patterns and the first to fourth color filters are disposed in the first to fourth cell spaces, respectively, and wherein the first to fourth shutter patterns are turned on or off to transmit light.

In accordance with an embodiment of the disclosed technology, an image sensor may include a plurality of unit pixels. Each of the unit pixels may include one photodiode region; a floating diffusion region disposed in a center of the photodiode region; first to fourth transfer gates that are disposed on first to fourth quadrants of the photodiode region to overlap with the floating diffusion region, and first to fourth PD bias patterns that are spaced apart from one another to surround the photodiode region.

In some implementations, the image sensor of claim 19, further comprising: pixel isolation patterns that are disposed to surround the first to fourth PD bias patterns to define a boundary of each of the unit pixels; and grid patterns configured to divide the photodiode region into first to fourth cell spaces corresponding to the first to fourth transfer gates.

DETAILED DESCRIPTION

Figure 1:
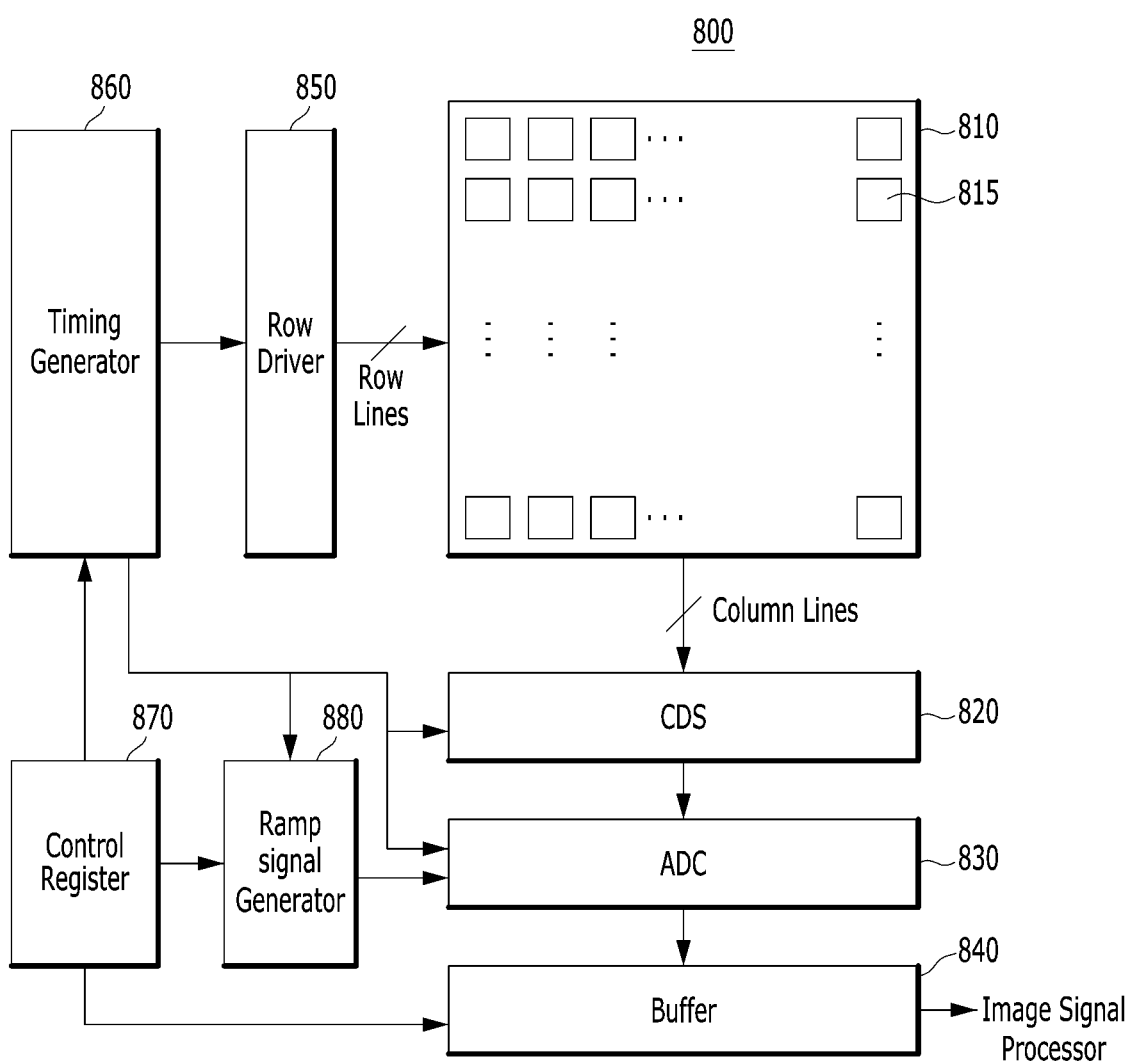
FIG. 1 is a block diagram schematically illustrating an exemplary image sensor in accordance with an embodiment of the disclosed technology.

The disclosed technology can be implemented to provide an image sensor designed to receive light in different colors using a single photodiode. For example, some implementations of the disclosed technology provide an image sensor having bias patterns that can generate photoelectrons having different color information and pixel isolation patterns disposed along outer periphery of the bias patterns.

In the present disclosure, advantages, features and methods for achieving them will become more apparent after a reading of the following exemplary embodiments taken in conjunction with the drawings. Throughout the disclosure, like reference numerals refer to like parts throughout the various figures and embodiments of the present invention.

As used herein, a singular form is intended to include plural forms as well, unless the context clearly indicates otherwise. It will be further understood that the terms "include" and/or "including," when used in this specification, specify the presence of at least one stated feature, step, operation, and/or element, but do not preclude the presence or addition of one or more other features, steps, operations, and/or elements thereof.

FIG. 1 is a block diagram schematically illustrating an image sensor 800 based on an embodiment of the disclosed technology. Referring to FIG. 1, the image sensor 800 may include a pixel array 810 in which a plurality of pixels is arranged in a matrix structure, e.g., an array of pixels arranged in rows and columns, a correlated double sampler (CDS) 820, an analog-digital converter (ADC) 830, a buffer 840, a row driver 850, a timing generator 860, a control register 870, and a ramp signal generator 880.

The pixel array 810 may include a plurality of pixel blocks 815 which are arranged in a matrix structure including columns and rows. In response to a reception of an incident light, each of the plurality of pixel blocks 815 can convert an optical image information on the received incident light into an electrical image signal, and transmit the electrical image signal to the correlated double sampler 820 through a column line. Each of the plurality of pixel blocks 815 may be coupled with one of row lines and one of column lines. A color filter may be arranged on pixel blocks in the pixel array 810 such that the light of a specific color may be input to each pixel. For example, each of the plurality of pixel blocks 815 may include three different color patterns such that a red pixel, a green pixel, and a blue pixel are arranged in the form of a matrix including columns and rows.

The correlated double sampler 820 can hold and sample the electrical image signals which are received from the pixel blocks 815 of the pixel array 810. For example, the correlated double sampler 820 can sample a reference voltage level and the voltage level of a received electrical image signal according to a clock signal provided from the timing generator 860, and transmit an analog signal corresponding to the difference therebetween to the analog-digital converter 830.

The analog-digital converter 830 can convert the received analog signal into a digital signal, and transmit the digital signal to the buffer 840.

The buffer 840 can store or latch the received digital signal and successively output the latched digital signal to an external image signal processor. The buffer 840 may include a memory to temporarily store or latch a digital signal and a sense amplifier for amplifying the digital signal.

The row driver 850 can drive the plurality of pixel blocks 815 of the pixel array 810 according to a signal of the timing generator 860. For example, the row driver 850 can generate select signals each for selecting one of the plurality of row lines and/or driving signals each for driving one of the plurality of row lines.

The timing generator 860 can generate a timing signal for controlling the correlated double sampler 820, the analog-digital converter 830, the row driver 850, and the ramp signal generator 880.

The control register 870 can generate control signals for controlling the buffer 840, the timing generator 860, and the ramp signal generator 880.

The ramp signal generator 880 can generate a ramp signal for controlling an image signal outputted from the buffer 840, according to control of the timing generator 860.

Each pixel block 815 of the image sensor 800 can include a photosensor or photosensing element that converts received light into electrical charges, which may be implemented in a suitable configuration, including a photodiode, a photogate, a phototransistor, a photoconductor, or some other photosensitive structure capable of generating photo-generated electrical charges. Each imaging pixel can also include a charge storage region for storing the photo-generated charges, which may be constructed as, for example, a floating diffusion region as disclosed in the examples below. Additional circuitry may be included in each imaging pixel, e.g., a transfer transistor for transferring the photo-generated charges from the photosensor or the photosensing element to the storage region and a reset circuitry for resetting the charges in the charge storage region after a readout.

Figure 2:
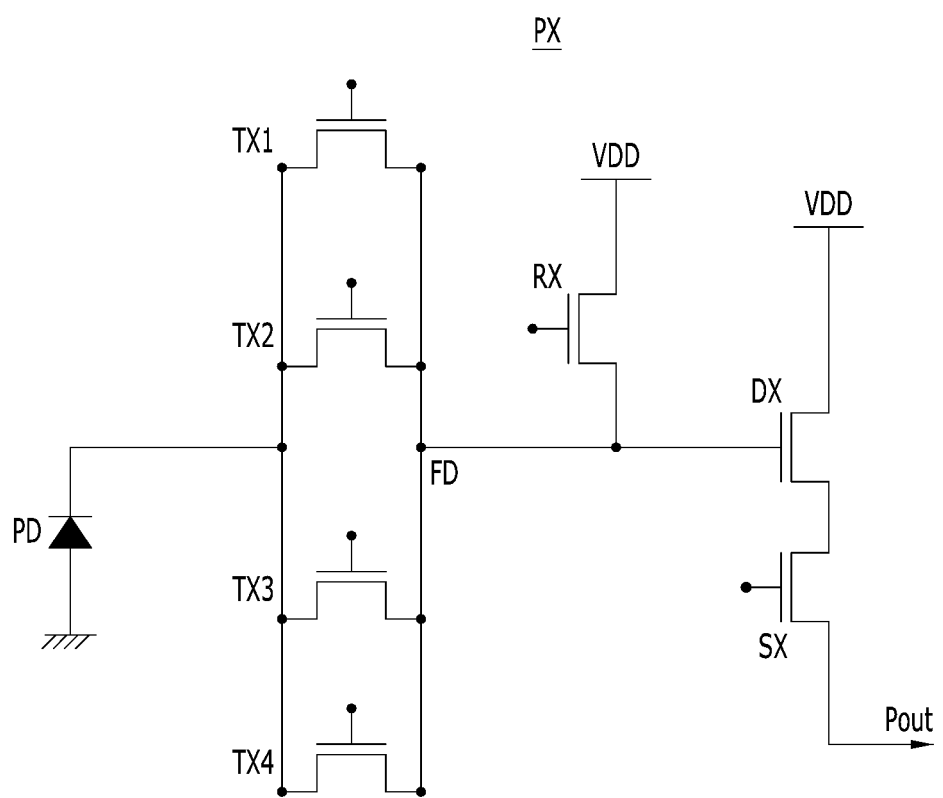
FIG. 2 is an equivalent circuit diagram of an exemplary unit pixel of an image sensor in accordance with an embodiment of the disclosed technology.

FIG. 2 is an equivalent circuit diagram of a unit pixel of the image sensor in accordance with an embodiment of the disclosed technology. Referring to FIG. 2, a unit pixel PX of an image sensor in accordance with the embodiment of the disclosed technology may include a photodiode PD, first to fourth transfer transistors TX1 to TX4, a floating diffusion region FD, a reset transistor RX, a drive transistor DX, a selection transistor SX, and an output port Pout.

In response to an incident light received thereon, the photodiode PD can receive light and generate electron-hole pairs.

The first to fourth transfer transistors TX1 to TX4 can transfer electrons generated in the photodiode PD to the floating diffusion region FD. The first to fourth transfer transistors TX1 to TX4 may be coupled in parallel, and may be turned exclusively to each other. For example, when one among the first to fourth transfer transistors TX1 to TX4 is turned on, the other three among the first to fourth transfer transistors TX1 to TX4 may be turned off and in a turn-off state.

The floating diffusion region FD may be coupled to a gate electrode of the drive transistor DX. The electrons in the floating diffusion region FD can turn on the drive transistor DX.

An electrical signal passing through the drive transistor DX may be outputted to the output port Pout through the selection transistor SX. The reset transistor RX can reset the floating diffusion region FD to a power source voltage VDD level. After the electric signal is outputted to the output port Pout, the floating diffusion FD may be reset to the initial voltage level, for example, the power source voltage VDD by the reset transistor RX.

The image sensor in accordance with the embodiment of the disclosed technology may include four transistors, which are first to fourth transfer transistors TX1 to TX4, coupled in parallel sharing one photodiode PD.

Figure 3A:
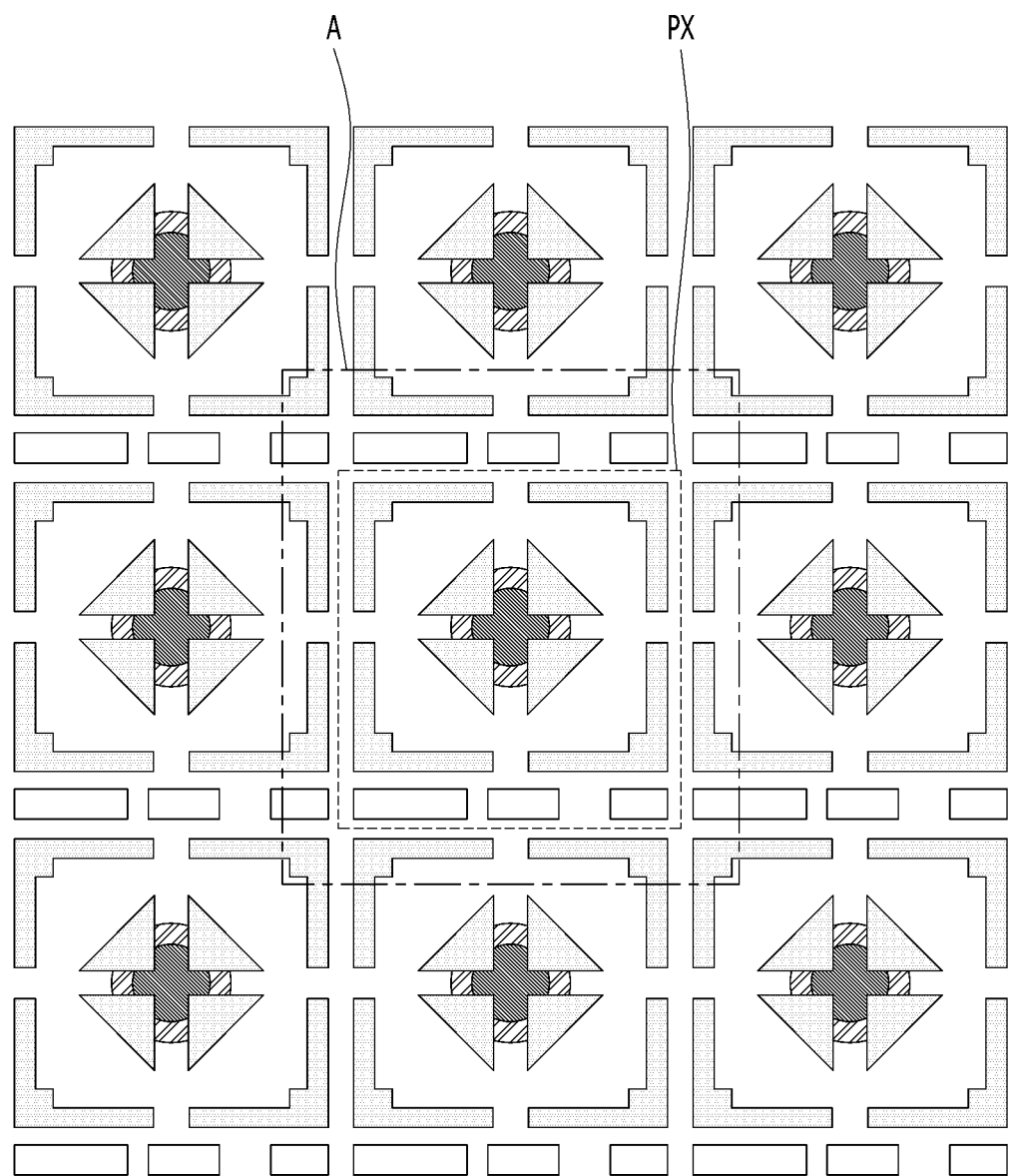
FIG. 3A is a schematic layout of an upper side of an exemplary pixel array of an image sensor in accordance with an embodiment of the disclosed technology.
Figure 3B:
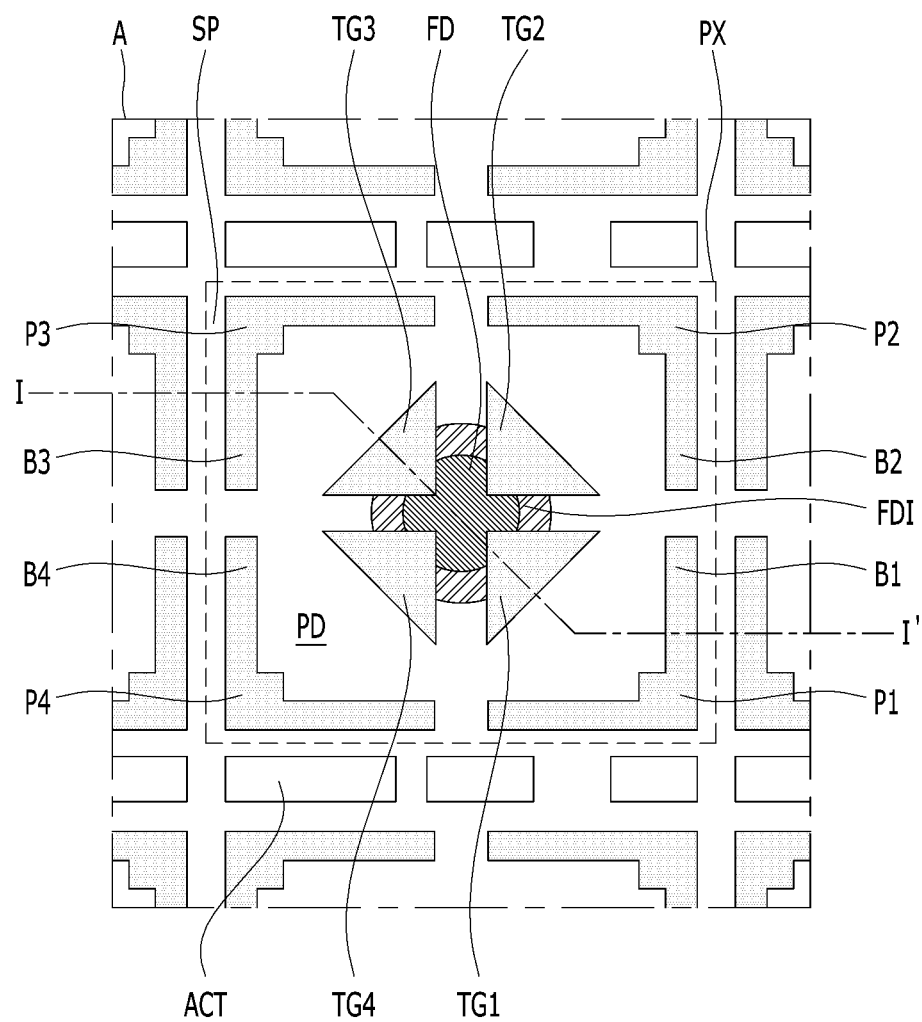
FIG. 3B is a magnified layout of an exemplary unit pixel of an image sensor in accordance with the embodiment of the disclosed technology.

FIG. 3A is a simple layout of an upper side of a pixel array of an image sensor in accordance with an embodiment of the disclosed technology. FIG. 3B is a magnified layout of a unit pixel of an image sensor in accordance with an embodiment of the disclosed technology.

Referring to FIG. 3A, the pixel array of the image sensor according to an exemplary embodiment of the disclosed technology may include a plurality of unit pixels PX arranged in a matrix shape, e.g., an array of pixel units PXs arranged in rows and columns. Referring to FIG. 3B, each of the unit pixels PX that are spaced apart from each other by a space region SP may include a photodiode region PD, first to fourth PD (photodiode) bias patterns B1 to B4, a floating diffusion region FD, a floating diffusion isolation region FDI, first to fourth transfer gates TG1 to TG4, and active regions ACT.

The photodiode region PD may include an N-type doped region which is formed in a substrate 10. Each of the first to fourth PD bias patterns B1 to B4 may have an elbow shape or an 'L' letter in a top view. For example, each of the first to fourth PD bias pattern has a shape having portions extending two different directions and a connecting portion between the extending portions. The first to fourth PD bias patterns B1 to B4 may be arranged on four different sides of the photodiode region PD. The first to fourth PD bias patterns B1 to B4 may surround the photodiode region PD to form a rectangular shape. In some implementations, the first to fourth PD bias patterns B1 to B4 may be disposed in the periphery of the photodiode region PD. The vertices of the first to fourth PD bias patterns B1 to B4 are arranged at four corners of the unit pixel PX. The vertices of the first to fourth PD bias patterns B1 to B4 may be directed toward the outside. The first to fourth PD bias patterns B1 to B4 may be disposed to be spaced apart from one another on first to fourth quadrants of the unit pixel PX, respectively. The first to fourth PD bias patterns B1 to B4 may include a conductor. For example, the first to fourth PD bias patterns B1 to B4 may include at least one of doped polycrystalline silicon, a metal, a metal compound, or a metal alloy, or combinations thereof. The first to fourth PD bias patterns B1 to B4 may include first to fourth pad regions P1 to P4, respectively. The first to fourth pad regions P1 to P4 may be portions of the first to fourth PD bias patterns B1 to B4. The first to fourth pad regions P1 to P4 can provide a space for contacting a contact plug for applying an electrical bias to the first to fourth PD bias patterns B1 to B4.

The floating diffusion region FD may be disposed at or around the center of the photodiode region PD. The floating diffusion region FD may be or include an N-type doped region. The floating diffusion isolation region FDI may be or include a P-type doped region. The floating diffusion isolation region FDI may be disposed to surround the floating diffusion region FD.

The first to fourth transfer gates TG1 to TG4 may be arranged on the first to fourth quadrants of the floating diffusion region FD, respectively. The first to fourth transfer gates TG1 to TG4 may partially surround the floating diffusion region FD together with the first to fourth PD bias patterns B1 to B4. The first to fourth transfer gates TG1 to TG4 may partially overlap with the floating diffusion region FD and the floating diffusion isolation region FDI. In some implementations, the first to fourth transfer gates TG1 to TG4 may be disposed over a region across the floating diffusion isolation region FDI. The first to fourth transfer gates TG1 to TG4 may include a conductor, such as doped polycrystalline silicon, a metal, a metal compound, or a metal alloy, or combinations thereof so as to transfer electrons generated in the photodiode region PD to the floating diffusion region FD. The floating diffusion isolation region FDI can provide channel regions of the first to fourth transfer gates TG1 to TG4.

The active regions ACT may be disposed adjacent to one side of the unit pixel PX to provide source regions, drain regions, and channel regions of a drive transistor, a selection transistor, and a reset transistor.

The photodiode region PD of the unit pixel PX of the image sensor in accordance with the present embodiment may be integrated into one without being divided into four.

Figure 4:
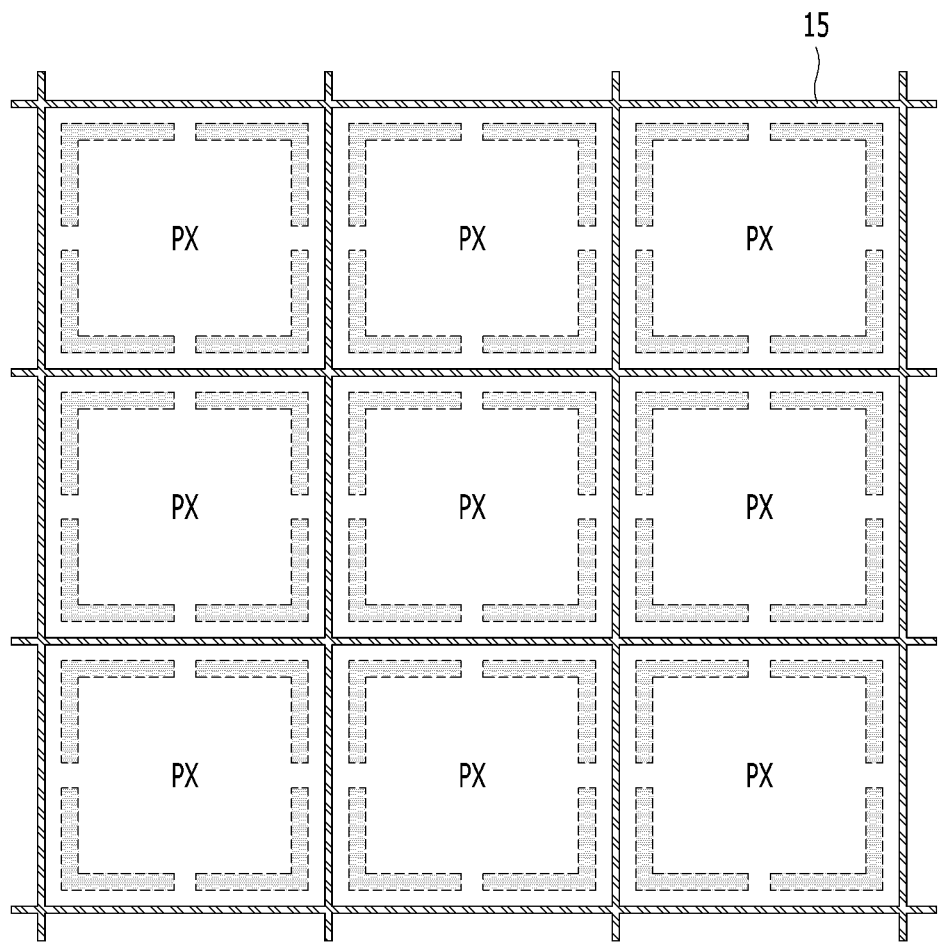
FIG. 4 is a layout of pixel isolation patterns of a lower side of an exemplary pixel array of an image sensor in accordance with an embodiment of the disclosed technology.

FIG. 4 is a layout of pixel isolation patterns 15 of a lower side of a pixel array of an image sensor in accordance with an embodiment of the disclosed technology. Referring to FIG. 4, the pixel isolation patterns 15 of the image sensor in accordance with the embodiment of the disclosed technology may be disposed and extending in a horizontal direction and a vertical direction. The pixel isolation patterns may be disposed between the neighboring unit pixels PX, for example, between some of the first to fourth PD bias patterns B1 to B4 of two adjacent neighboring unit pixels PX. In a top view or a longitudinal cross-sectional view, the pixel isolation patterns 15 may be disposed in a mesh form to surround the photodiode regions PD and the first to fourth PD bias patterns B1 to B4 of the unit pixel PX. In some implementations, the pixel isolation pattern 15 may be disposed along the outer periphery of the bias patterns B1 to B4 to provide a unit pixel PX. In some implementations, the unit pixel PX may have a portion vertically overlapping with the space region SP which is disposed between the unit pixels PX. The pixel isolation patterns 15 may include horizontal lines and vertical lines that are not physically separated from each other but orthogonal to each other, and may be coupled to one another.

Figure 5:
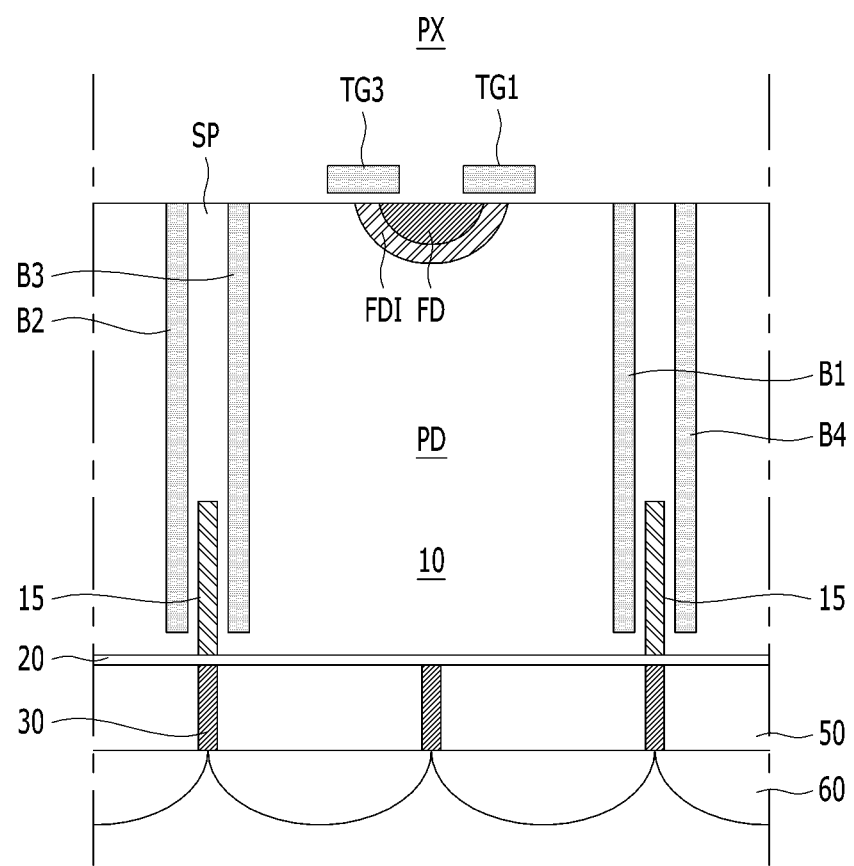
FIG. 5 is a longitudinal cross-sectional view of the unit pixel of the image sensor taken along a line I-I' of FIG. 3B.

FIG. 5 is a longitudinal cross-sectional view of the unit pixel of the image sensor taken along a line I-I' of FIG. 3B. Referring to FIG. 5, the image sensor in accordance with the embodiment of the disclosed technology may include first to fourth PD bias patterns B1 to B4 in the substrate 10, the photodiode region PD, the floating diffusion region FD, the floating diffusion isolation region FDI, the pixel isolation patterns 15, the first to fourth transfer gates TG1 to TG4 on an upper side of the substrate 10, an antireflection layer 20 on a lower side of the substrate 10, grid patterns 30, shutter patterns 40, color filters 50, and micro-lenses 60.

The first to fourth PD bias patterns B1 to B4 may be formed in the shape of a partition wall filling deep trenches. For example, the first to fourth PD bias patterns B1 to B4 may include a lining insulating layer formed on the inner walls of the deep trenches formed in the inside of the substrate 10, and a conductive plug fully filling the deep trenches on the lining insulating layer. In some implementations, the conductive plug may fully fill the deep trenches over the lining insulation layer. The lining insulating layer may include a silicon oxide and/or a silicon nitride. The conductive plug may include at least one of doped polycrystalline silicon, a metal, a metal compound, or a metal alloy, or combinations thereof. Therefore, the photodiode region PD may be electrically isolated from the first to fourth PD bias patterns B1 to B4. The first to fourth PD bias patterns B1 to B4 may be formed to extend from the upper side of the substrate 10 toward the inside of the substrate 10, and the lower portions of the first to fourth PD bias patterns B1 to B4 may be spaced apart from the lower side of the substrate 10. For example, the substrate has a thickness greater than that of the first to fourth PD bias patterns B1 to B4. In the figure, the first and third PD bias patterns B1 and B3 may be included in the same unit pixel PX, and the second and fourth PD bias patterns B2 and B4 may be included in other unit pixels PX which are disposed adjacent to the unit pixel PX including the first and third PD bias patterns B1 and B3. The space regions SP may be interposed between the neighboring unit pixels PX.

Referring to the cross-sectional view of FIG. 5, the photodiode region PD may be disposed between first and third PD bias patterns B1 and B3 in the unit pixel PX. In some implementations, the photodiode region PD may be surrounded by the first to fourth PD bias patterns B1 to B4. The floating diffusion isolation region FDI and the floating diffusion region FD may be formed in an upper portion of or around the center of the photodiode region PD. The floating diffusion isolation region FDI may surround the floating diffusion region FD in the shape of a pocket. The photodiode region PD and the floating diffusion region FD may be electrically isolated from each other. The first and third transfer gates TG1 and TG3 may be disposed on the photodiode region PD so as to partially and vertically overlap with portions of the floating diffusion region FD and the floating diffusion isolation region FDI. The first and third transfer gates TG1 and TG3 may be disposed to traverse the floating diffusion isolation region FDI. Therefore, the floating diffusion isolation region FDI may be used as channel regions for transferring photoelectrons between the photodiode region PD and the floating diffusion region FD.

The pixel isolation patterns 15 may be formed in the lower portion of the substrate 10 in a shape of a partition wall which is smaller than the first to fourth PD bias patterns B1 to B4. The first to fourth PD bias patterns B1 to B4 may be formed to extend from the upper side of the substrate 10, for example, the top surface of the substrate 10, into the inside of the substrate. The pixel isolation patterns 15 may be formed to extend from the lower side of the substrate 10, for example the bottom surface of the substrate 10, into the inside of the substrate. The vertical length or the vertical depth of the pixel isolation patterns 15 may be shorter than the vertical length or the vertical depth of the first to fourth PD bias patterns B1 to B4. The pixel isolation patterns 15 may be formed in the space region SP to be spaced apart from the first to fourth PD bias patterns B1 to B4. In other words, the pixel isolation patterns 15 may extend between two of the first and fourth PD bias patterns B1 to B4 of the neighboring unit pixels PX. The pixel isolation patterns 15 may include an insulating material. For example, the pixel isolation patterns 15 may include an insulating material filling the trenches formed from the lower side of the substrate 10 to the inside. The insulating material may include a silicon oxide, or a silicon nitride, or a combination thereof.

The antireflection layer 20 may be formed over the lower side of the substrate 10. The antireflection layer 20 may have a flat shape. The antireflection layer 20 may include a single layer or multilayer of or including a dielectric inorganic layer, such as a silicon nitride, a silicon oxide, or a silicon oxynitride.

A portion of the grid patterns 30 may be aligned or disposed to vertically overlap with a central portion (e.g., the floating diffusion region FD and the floating diffusion isolation region FDI) of the photodiode region PD. Some portions of the grid patterns 30 may be aligned or disposed to overlap with the pixel isolation patterns 15 in the space regions SP. Also, portions of the grid patterns 30 may be aligned to vertically overlap with the pixel isolation patterns 15. The grid patterns 30 may include a conductor such as a metal. Accordingly, a voltage may be applied to the grid patterns 30.

The color filters 50 may be formed between the grid patterns 30. Each of the color filters 50 may include a polymeric organic material including one pigment among green, red, or blue. The micro-lenses 60 may be formed over the color filters 50, respectively. The micro-lenses 60 may include a transparent polymer organic material or an inorganic material such as a silicon oxide.

FIGS. 6A to 6D are top views illustrating operations of an unit pixel in first to fourth operation cycles of the image sensor in accordance with an embodiment of the disclosed technology.

Figure 6A:
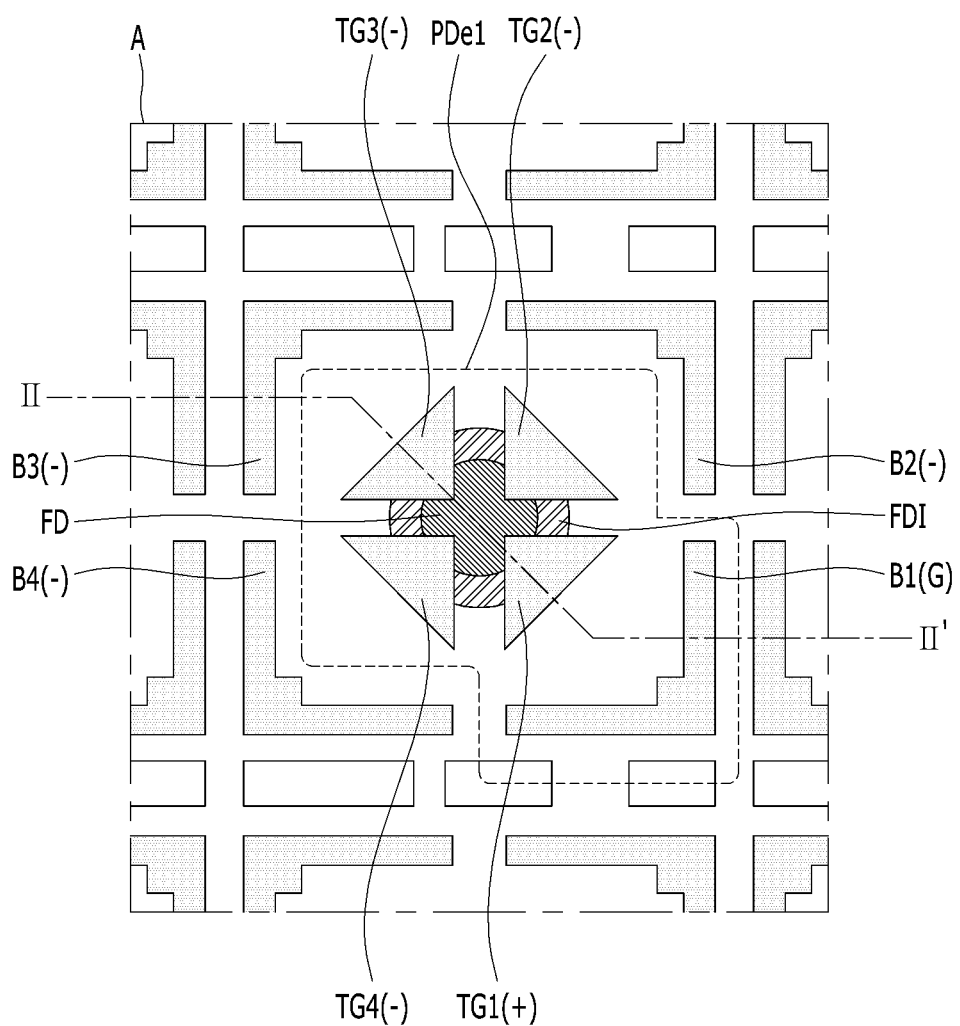
FIGS. 6A to 6D are top views illustrating operations of the unit pixel in first to fourth operation cycles of an image sensor in accordance with an embodiment of the disclosed technology.

Referring to FIG. 6A, when the first PD bias pattern B1 of the unit pixel PX is grounded (G) and a negative (−) voltage is applied to the second to fourth PD bias patterns B2 to B4 in the first operation section, a first effective photodiode region PDe1 may be defined as shown with the dotted line in the figure. To be specific, since the second to fourth PD bias patterns B2 to B4 to which the negative (−) voltage is applied can provide a depletion region where there is no electron in the photodiode region PD, the photodiode region PD in which photoelectrons are generated may be reduced around the second to fourth PD bias patterns B2 to B4. The first PD bias pattern B1 which is grounded may enlarge the photodiode region PD in which electrons are generated. In the first operation cycle, the effective photodiode region PDe1 may include the enlarged periphery of the first PD bias pattern B1 and the reduced peripheries of the second to fourth PD bias patterns B2 to B4, as compared to the photodiode region shown in FIGS. 3A and 3B. In the first operation cycle, a positive voltage (+) may be applied to the first transfer gate TG1 and a negative voltage (−) may be applied to the second to fourth transfer gates TG2 to TG4. Thus, in the first operation cycle, the first transfer gate TG1 may transfer photoelectrons generated in the first effective photodiode region PDe1 to the floating diffusion region FD through the floating diffusion isolation region FDI.

Figure 6B:
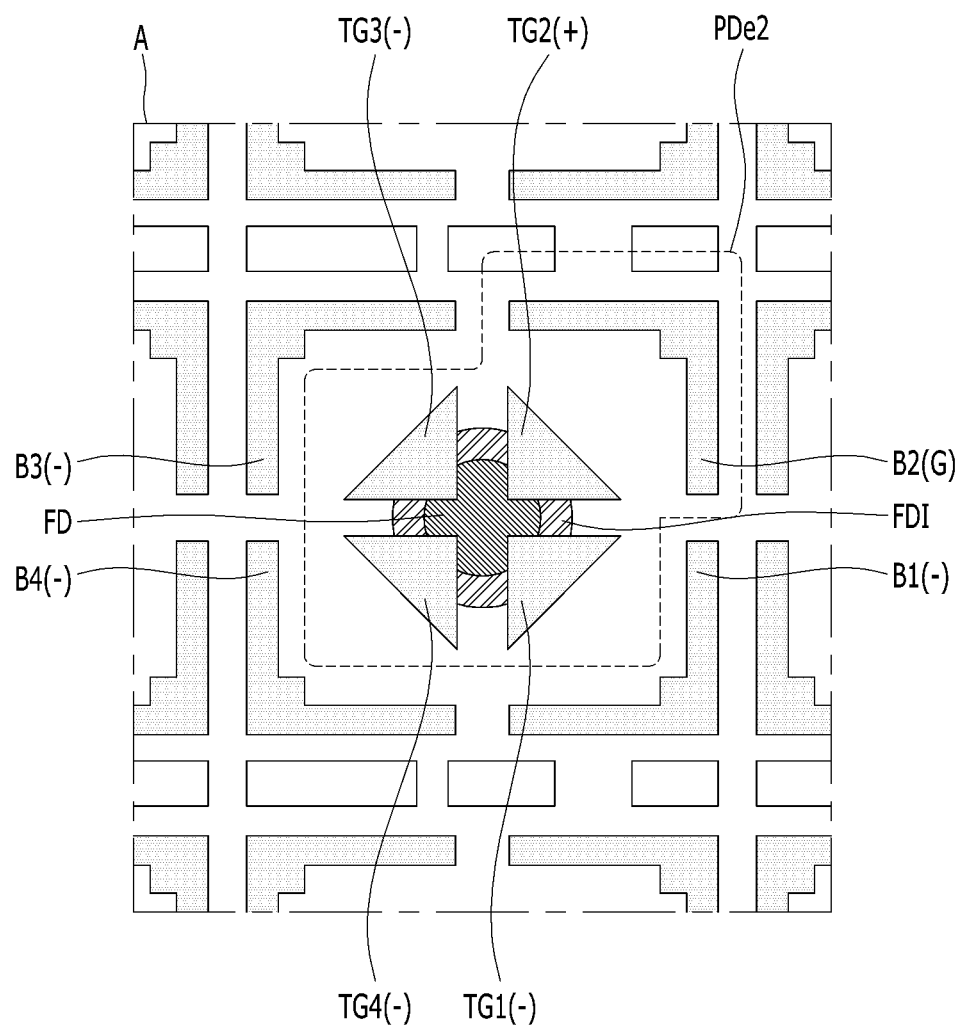

Referring to FIG. 6B, when the second PD bias pattern B2 of the unit pixel PX is grounded (G) and a negative (−) voltage is applied to the first, third, and fourth PD bias patterns B1, B3, and B4 in the second operation cycle, a second effective photodiode region PDe2 may be defined as shown with the dotted line in the figure. To be specific, since the first, third, and fourth PD bias patterns B1, B3, and B4 to which the negative (−) voltage is applied can provide a depletion region where there is no electron in the photodiode region PD, the photodiode region PD in which photoelectrons are generated may be reduced around the first, third, and fourth PD bias patterns B1, B3, and B4. The second PD bias pattern B2 which is grounded may enlarge the photodiode region PD in which electrons are generated. In other words, in the second operation cycle, the effective photodiode region PDe2 may include the enlarged periphery of the second PD bias pattern B2 and the reduced peripheries of the first, third, and fourth PD bias patterns B1, B3, and B4 as compared to the photodiode region shown in FIGS. 3A and 3B. In the second operation cycle, a positive (+) voltage may be applied to the second transfer gate TG2, and a negative voltage (−) may be applied to the first, third, and fourth transfer gates TG1, TG3, and TG4. Thus, in the second operation cycle, the second transfer gate TG2 may transfer photoelectrons generated in the second effective photodiode region PDe2 to the floating diffusion region FD through the floating diffusion isolation region FDI.

Figure 6C:
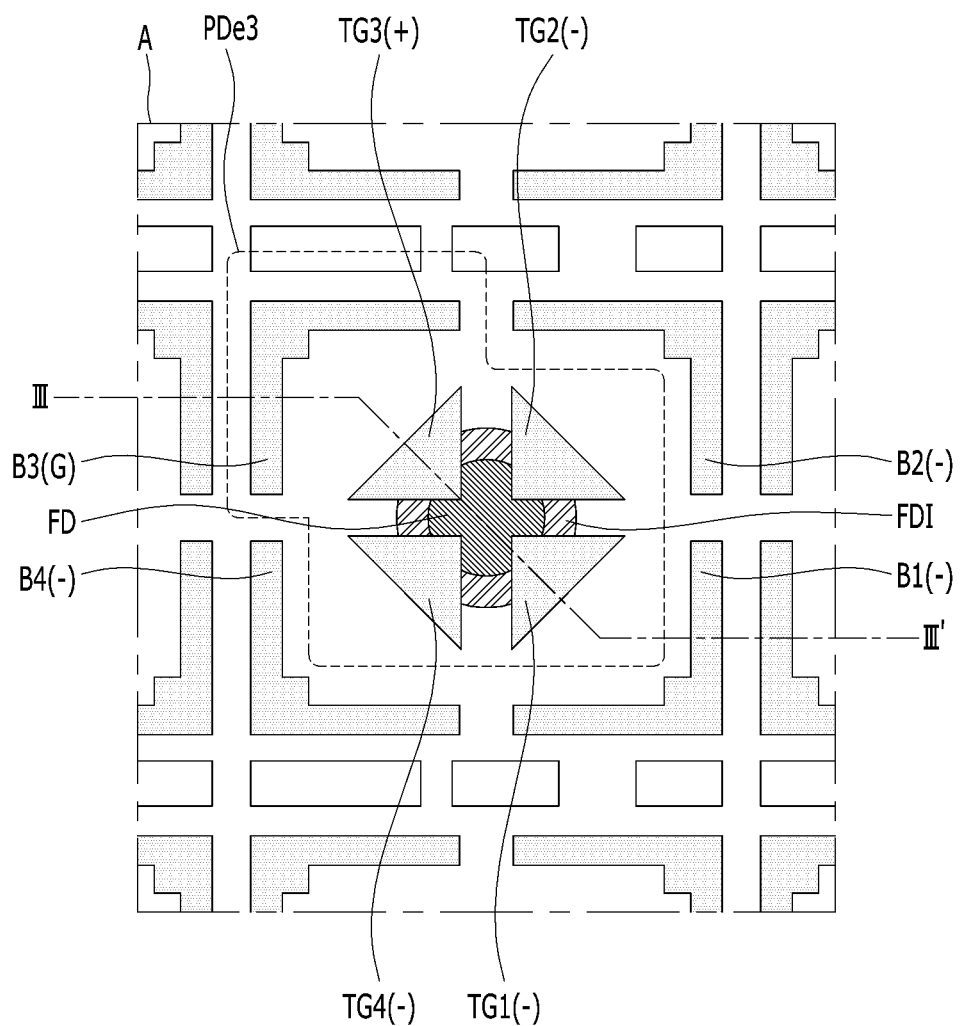

Referring to FIG. 6C, when the third PD bias pattern B3 of the unit pixel PX is grounded (G) and a negative (−) voltage is applied to the first, second, and fourth PD bias patterns B1, B2, and B4 in the third operation cycle, a third effective photodiode region PDe3 may be defined as shown with the dotted line in the figure. To be specific, since the first, second, and fourth PD bias patterns B1, B2, and B4 to which the negative (−) voltage is applied can provide a depletion region where there is no electron in the inside of the photodiode region PD, the photodiode region PD in which photoelectrons are generated may be reduced around the first, second, and fourth PD bias patterns B1, B2, and B4. The third PD bias pattern B3 which is grounded may enlarge the photodiode region PD in which electrons are generated. In the third operation cycle, the third effective photodiode region PDe3 may include the enlarged periphery of the third PD bias pattern B3 and the reduced peripheries of the first, second, and fourth PD bias patterns B1, B2, and B4. In the third operation cycle, a positive (+) voltage may be applied to the third transfer gate TG3, and a negative (−) voltage may be applied to the first, second, and fourth transfer gates TG1, TG2, and TG4. Thus, in the third operation cycle, the third transfer gate TG3 may transfer photoelectrons generated in the third effective photodiode region PDe3 to the floating diffusion region FD through the floating diffusion isolation region FDI.

Figure 6D:
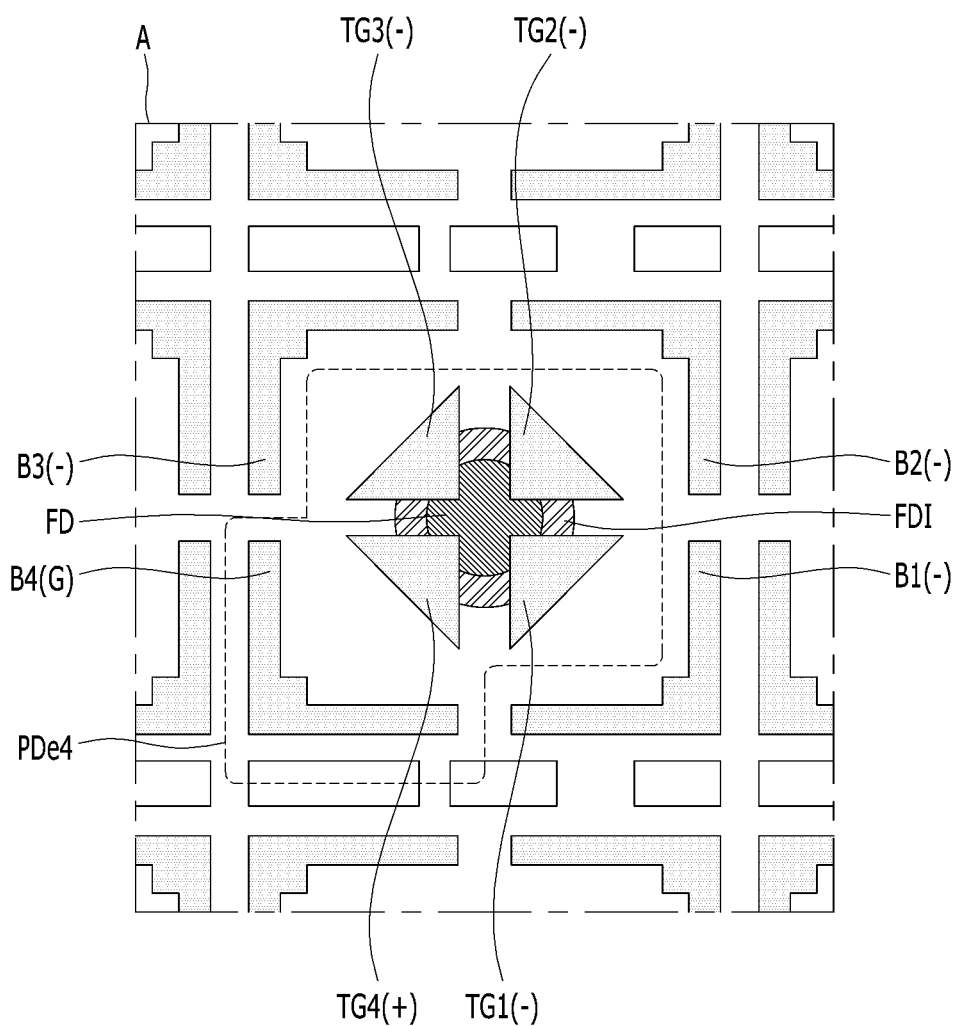

Referring to FIG. 6D, when the fourth PD bias pattern 34 of the unit pixel PX is grounded (G) and a negative (−) voltage is applied to the first to third PD bias patterns B1 to B3 in the fourth operation cycle, a fourth effective photodiode region Pde4 may be defined as shown with the dotted line in the figure. To be specific, since the first to third PD bias patterns B1 to B3 to which the negative (−) voltage is applied can provide a depletion region where there is no electron in the inside of the photodiode region PD, the photodiode region PD in which photoelectrons are generated may be reduced around the first to the third PD bias patterns B1 to B3. The fourth PD bias pattern B4 which is grounded may enlarge the photodiode region PD in which electrons are generated. In the fourth operation cycle, the fourth effective photodiode region Pde4 may include the enlarged periphery of the fourth PD bias pattern B4 and the reduced peripheries of the first to third PD bias patterns B1 to B3, as compared to the photodiode regions shown in FIGS. 3A and 3B. In the fourth operation cycle, a positive (+) voltage may be applied to the fourth transfer gate TG4, and a negative (−) voltage may be applied to the first to third transfer gates TG1 to TG3. Thus, in the fourth operation cycle, the fourth transfer gate TG4 may transfer photoelectrons generated in the fourth effective photodiode region Pde4 to the floating diffusion region FD through the floating diffusion isolation region FDI.

Figure 7A:
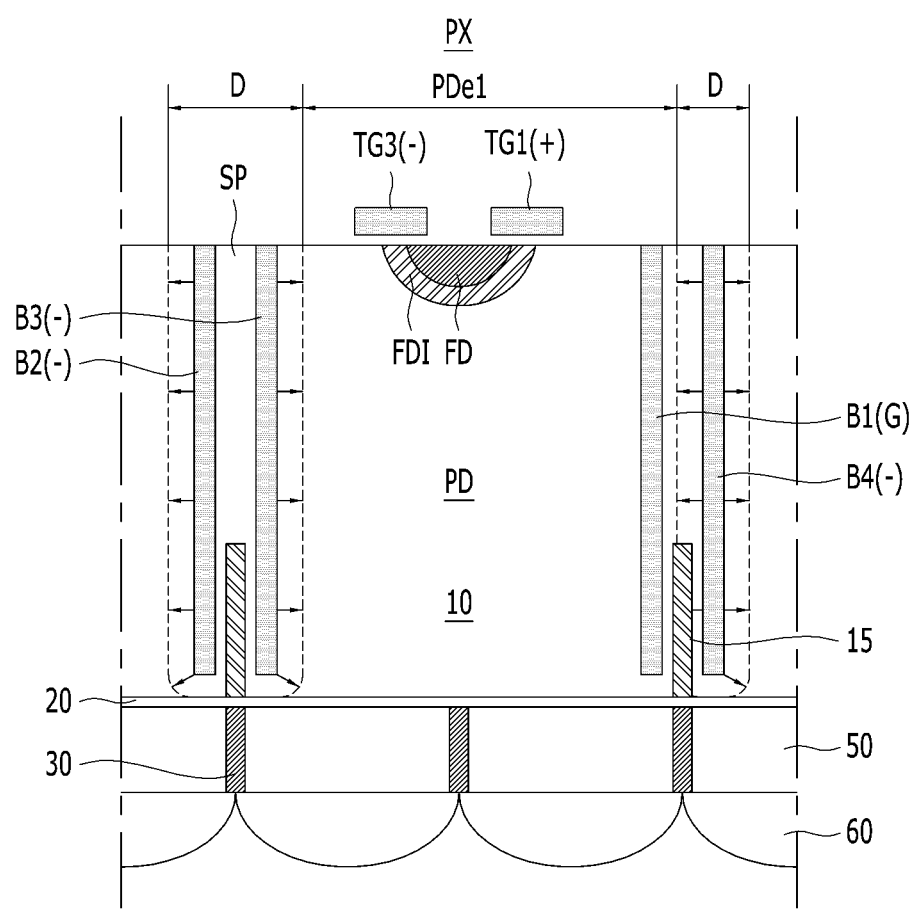
FIGS. 7A and 7B are longitudinal cross-sectional views of an example of the unit pixel of the image sensor taken along a line II-II' of FIG. 6A and a line III-III' of FIG. 6C.
Figure 7B:
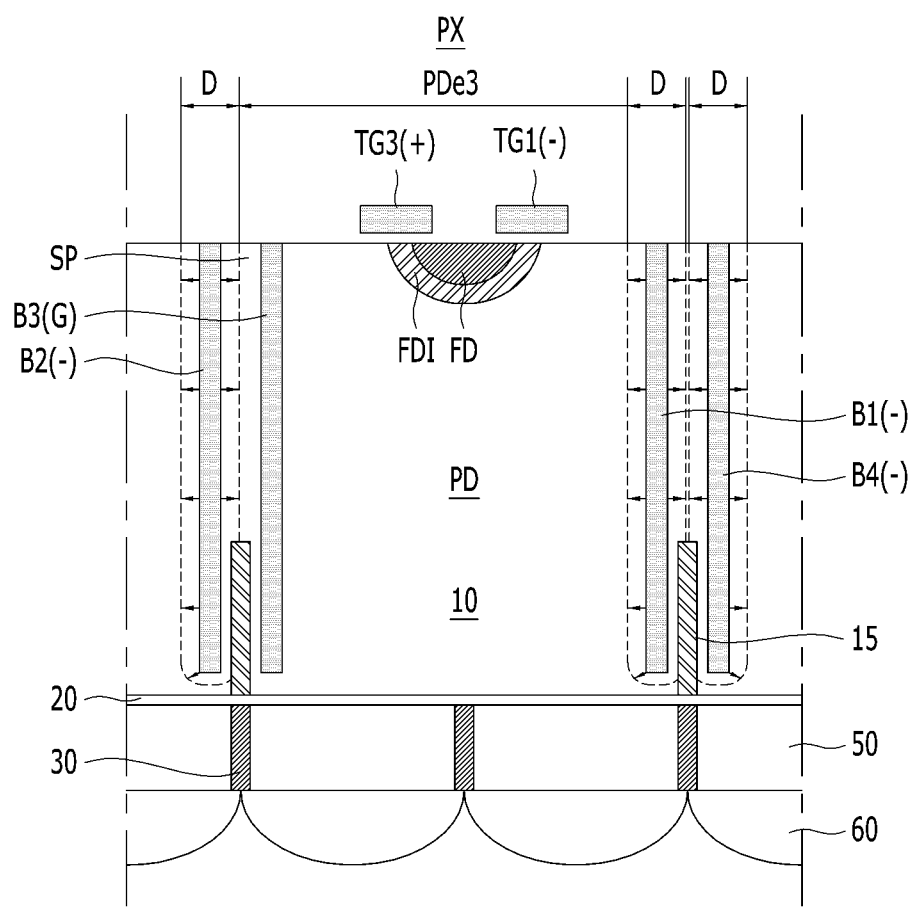

FIGS. 7A and 7B are longitudinal cross-sectional views of the unit pixel PX of the image sensor taken along a line II-II' of FIG. 6A and a line III-III' of FIG. 6C. For example, FIG. 7A is a longitudinal cross-sectional view of the unit pixel PX of the image sensor in a dark mode, that is, when a small amount of light is received in the photodiode region PD, and FIG. 7B is a longitudinal cross-sectional view of the unit pixel PX of the image sensor in a bright mode, that is, when a sufficient amount of light is received in the photodiode area PD.

Referring to FIG. 7A, in the dark mode, the first PD bias pattern B1 may be grounded (G), and a sufficient amount of negative voltage may be applied to the second to fourth PD bias patterns B2 to B4. In the dark mode, a dark current may have a relatively large influence on the sensitivity of the image sensor. Therefore, in the dark mode, it is preferable to apply a relatively sufficient amount of negative voltage to the second to fourth PD bias patterns B2 to B4 in order to form the depletion regions D relatively wide and large. In this case, the pixel isolation patterns 15 may be included in the depletion regions D. The space region SP between the second PD bias pattern B2 and the third PD bias pattern B3 to which the negative voltage is applied may be transformed into the depletion region D. In some implementations, the entire space region SP between the second PD bias pattern B2 and the third PD bias pattern B3 is included in the depletion region D. The space region SP between the first PD bias pattern B1 which is grounded (G) and the fourth PD bias pattern B4 may be partially transformed to the depletion regions D. The space between the second to fourth PD bias patterns B2 to B4 and the lower side of the substrate 10, for example, the bottom surface of the substrate 10, may be transformed into the depletion regions D. In some implementations, the entire space between the second to fourth PD bias patterns B2 to B4 and the bottom surface of the substrate 10 is included in the depletion region D. In some implementations, a portion between the second to fourth PD bias patterns B2 to B4 and the lower side of the substrate 10, for example, the bottom surface of the substrate 10, may not be transformed into the depletion region D. In this case, the region which is not transformed to the depletion region D may be or form a photoelectron leakage path. However, according to the embodiment of the present embodiment, the pixel isolation patterns 15 can block the photoelectron leakage path.

Referring to 7B, in the bright mode, the third PD bias pattern B3 may be grounded (G), and a relatively small amount of negative (−) voltage may be applied to the first, second, and fourth PD bias patterns B1, B2, and B4. In the bright mode, the influence of a dark current on the sensitivity of the image sensor may be relatively small. Therefore, it is preferable to form the depletion regions D relatively small by applying a relatively small negative (−) voltage to the first, second, and fourth PD bias patterns B1, B2, and B4 in the bright mode. Power consumption may be reduced, and photoelectrons may be easily generated by increasing the first effective photodiode region PDe3, and thus the sensitivity of the image sensor may be improved. In the bright mode, since the depletion regions D are formed relatively small, a portion of the space region D may not be transformed into the depletion region D. To be specific, a portion of the space region SP between the second PD bias pattern B2 and the third PD bias pattern B3 and a portion of the space region SP between the first PD bias pattern B1 and the fourth PD bias pattern B4 may be partially transformed into the depletion regions D. Also, a portion of the space between the first, second, and fourth PD bias patterns B1, B2, and B4 and the lower side of the substrate 10, for example, the bottom surface of the substrate 10, may not be transformed into the depletion regions D. As mentioned above, the region which is not transformed may be or form a photoelectron leakage path, but the pixel isolation patterns 15 can block the photoelectron leakage path.

Figure 8:
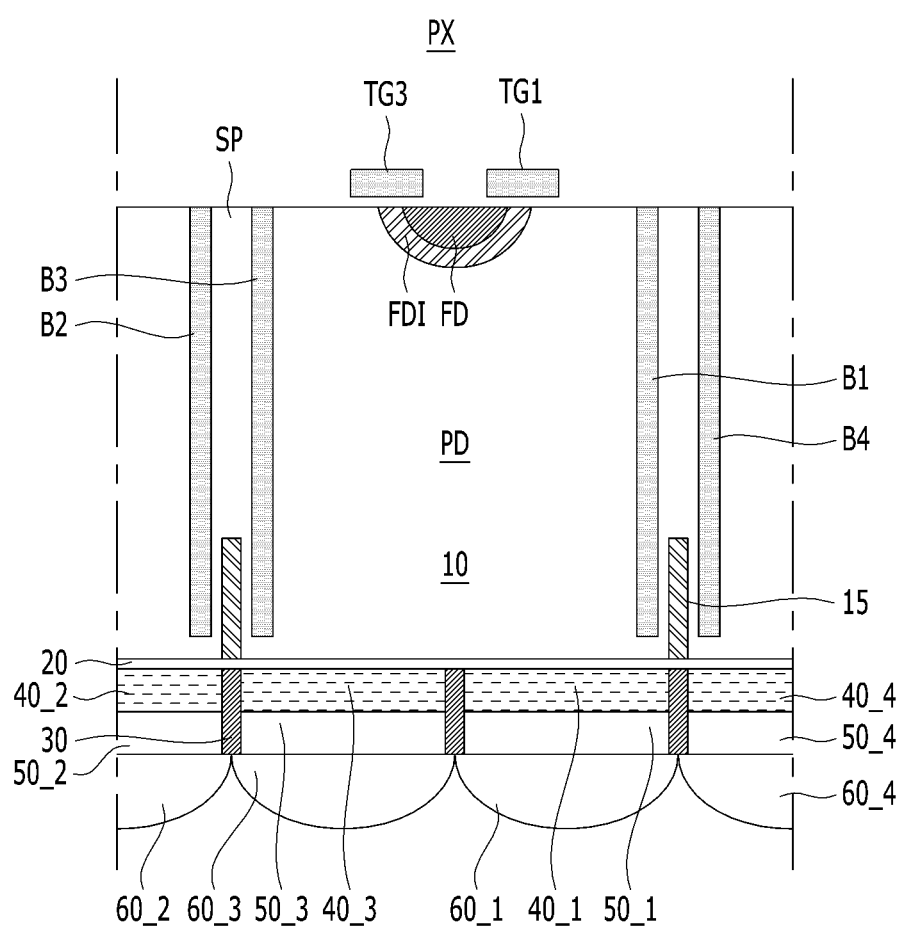
FIG. 8 is a longitudinal cross-sectional view of an unit pixel of an image sensor taken along a line I-I' of FIG. 3B in accordance with another embodiment of the disclosed technology.

FIG. 8 is a longitudinal cross-sectional view of the unit pixel PX of the image sensor taken along a line I-I' of FIG. 3B in accordance with another embodiment of the disclosed technology. Referring to FIG. 5, the image sensor may further include shutter patterns 40_1, 40_2, 40_3, and 40_4 formed between the grid patterns 30 along a direction parallel to a top surface of the substrate 10. The shutter patterns 40_1, 40_2, 40_3, and 40_4 may be interposed between the anti-reflection layer 20 and the color filters 50 along another direction orthogonal to the top surface of the substrate. The shutter patterns 40_1, 40_2, 40_3, and 40_4 may be turned on or off to selectively transmit light. For example, the shutter patterns 40_1, 40_2, 40_3, and 40_4 can block or transmit light based on an electric field generated according to the voltage applied by the grid patterns 50. The shutter patterns 40_1, 40_2, 40_3, and 40_4 may include a light blocking material layer such as a polarizing filter or a liquid crystal display (LCD). The shutter patterns 40_1, 40_2, 40_3, and 40_4 may be disposed to correspond to the first to fourth PD bias patterns B1 to B4, respectively. The first to fourth color filters 50_1 to 50_4 may be disposed to correspond to the first to the shutter patterns 40_1, 40_2, 40_3, and 40_4, respectively. The first to fourth micro-lenses 60_1 to 60_4 may be disposed to correspond to the first to fourth color filters 50_1 to 50_4, respectively.

Figure 9A:
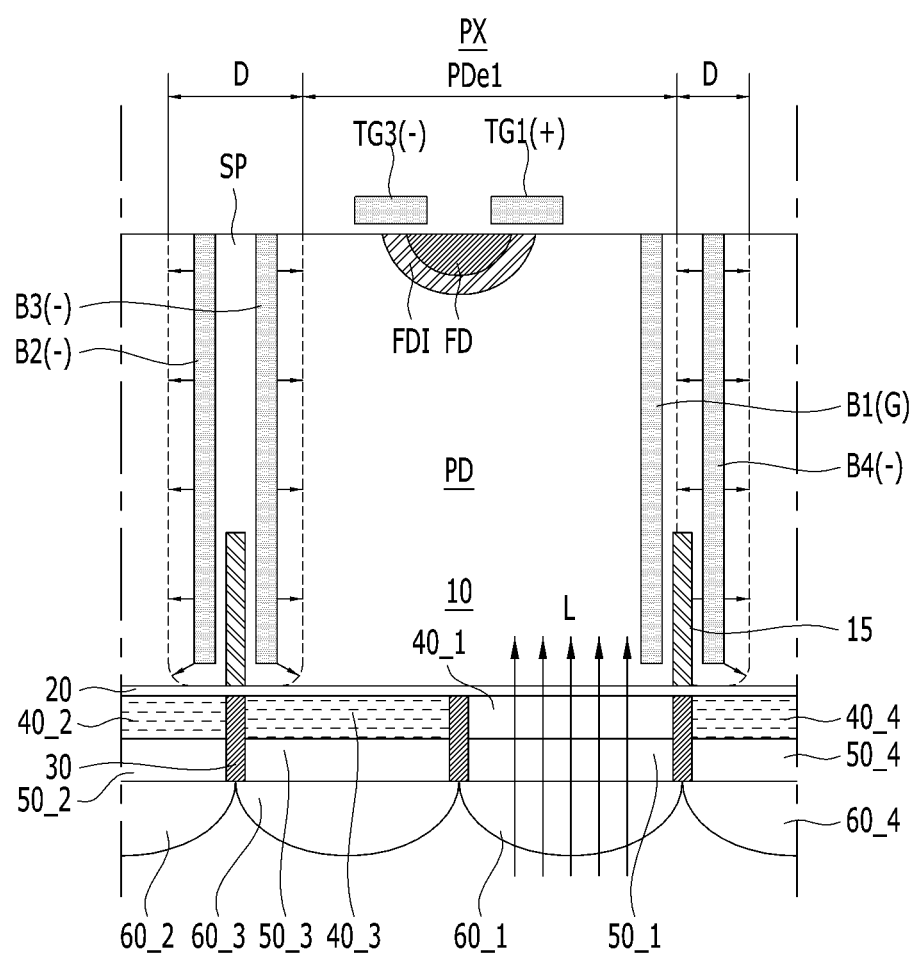
FIG. 9A is a longitudinal cross-sectional view of an example of the unit pixel of the image sensor taken along a line II-II' of FIG. 6A.

FIG. 9A is a longitudinal cross-sectional view of an example of the unit pixel PX of the image sensor taken along a line II-IF of FIG. 6A. Referring to FIG. 9A, in the first operation cycle of the dark mode, as the depletion regions D are formed in the peripheries of the second to fourth PD bias patterns B2 to B4 to which a negative (−) voltage is applied, the first effective photodiode region PDe1 may be defined. In the first operation cycle, the first shutter pattern 40_1 may be opened and the second to fourth shutter patterns 40_2 to 40_4 may be blocked. Therefore, the light L can reach the first effective photodiode region PDe1 only through the first shutter pattern 40_1 and the first color filter 50_1 and the first micro-lens 60_1 that are disposed over the first shutter pattern 40_1. Thus, the light L transmitted through the first micro-lens 60_1, the first color filter 50_1 and the first shutter pattern 40_1 can be irradiated into the first effective photodiode region PDe1 and the light (e.g., in different colors) transmitted through the second to fourth micro-lenses 60_2 to 60_4 and the second to fourth color filters 50_2 to 50_4 cannot be irradiated into the first effective photodiode region PDe1. The first effective photodiode region PDe1 may have only the color information as same as the first color filter 50_1. In the first operation cycle, a positive (+) voltage may be applied to the first transfer gate TG1, and a negative (−) voltage may be applied to the second to fourth transfer gates TG2 to TG4. Thus, only the first transfer gate TG1 may be turned on, and thus the photoelectrons in the first effective photodiode region PDe1 may be transferred to the floating diffusion region FD.

Figure 9B:
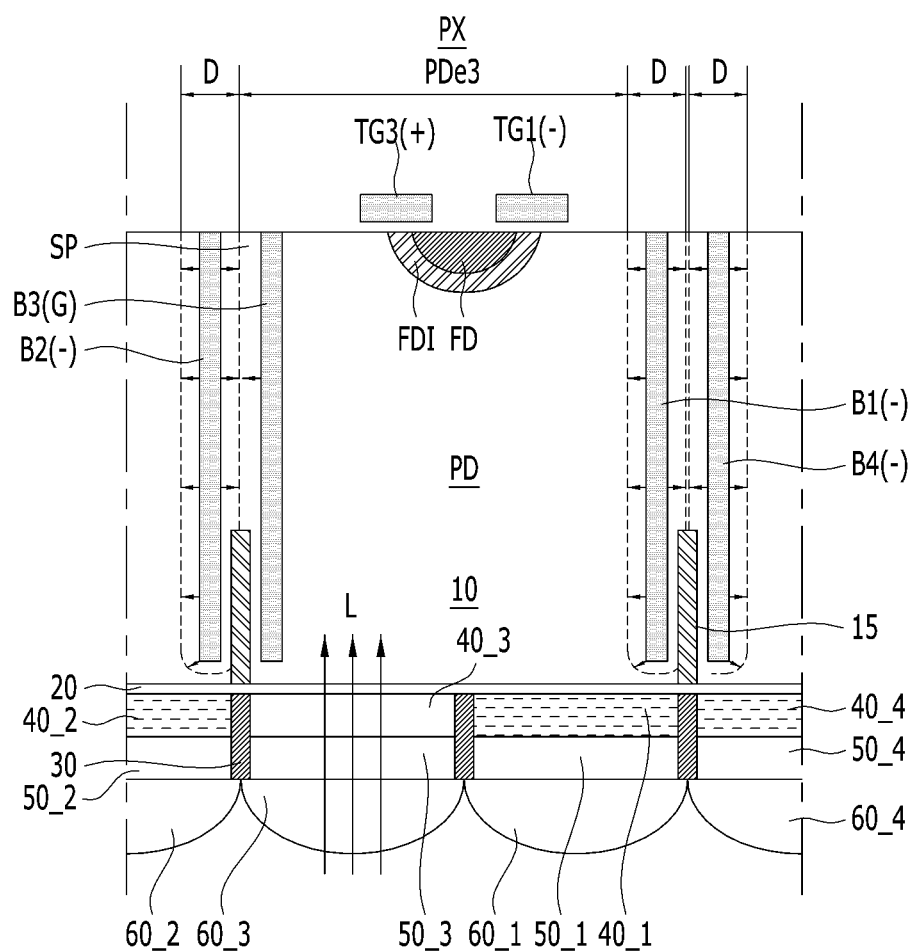
FIG. 9B is a longitudinal cross-sectional view of the unit pixel of the image sensor taken along a line III-III' of FIG. 6C.

FIG. 9B is a longitudinal cross-sectional view of an example of the unit pixel PX of the image sensor taken along a line III-III' of FIG. 6C. Referring to FIG. 9B, it may be shown that the third effective photodiode region PDe3 is defined as the depletion regions D are generated in the peripheries of the first, second, and fourth PD bias patterns B1, B2, and B4 to which a negative (−) voltage is applied in the third operation section of the bright mode. In the third operation cycle, the third shutter pattern 40_3 may be opened, and the first, second, and fourth shutter patterns 40_1, 40_2, and 40_4 may be blocked. Therefore, the light L can reach the third effective photodiode region PDe3 only through the third shutter pattern 40_3 and the third color filter 50_3 and the third micro-lens 60_3 that are disposed over the third shutter pattern 40_3. Thus, the light L transmitted through the third micro-lens 60_3, the third color filter 50_3, and the third shutter pattern 40_3 can be irradiated into the third effective photodiode area PDe3, and the light transmitted through the first, second, and fourth micro-lenses 60_1, 60_2, and 60_4, and the first, second, and fourth color filters 50_1, 50_2, and 50_4 cannot be irradiated into the third effective photodiode region PDe3. The third effective photodiode region PDe3 may have the same color information as the third color filter 50_3. In the third operation cycle, a positive (+) voltage may be applied to the third transfer gate TG3, and a negative (−) voltage may be applied to the first, second, and fourth transfer gates TG1, TG2, and TG4. Thus, only the third transfer gate TG3 may be turned on, and thus the photoelectrons in the third effective photodiode region PDe3 may be transferred to the floating diffusion region FD.

Referring to FIG. 6A, when the first shutter pattern 40_1 is opened and the second to fourth shutter patterns 40_2 to 40_4 are blocked in the first operation cycle, the first effective photodiode region PDe1 can generate photoelectrons having the first color information obtained by or from the first color filter 50_1. The photoelectrons having the first color information may be transferred by the first transfer gate TG1 to the floating diffusion region FD.

Referring to FIG. 6B, when the second shutter pattern 40_2 is opened and the first, third, and fourth shutter patterns 40_1, 40_3, and 40_4 are blocked in the second operation cycle, the second effective photodiode region PDe2 can generate photoelectrons having the second color information obtained by or from the second color filter 50_2. The photoelectrons having the second color information may be transferred by the second transfer gate TG2 to the floating diffusion region FD.

Referring to FIG. 6C, when the third shutter pattern 40_3 is opened and the first, second, and fourth shutter patterns 40_1, 40_2, and 40_4 are blocked in the third operation cycle, the third effective photodiode region PDe3 can generate photoelectrons having the third color information obtained by or from the third color filter 50_3. The photoelectrons having the third color information may be transferred by the third transfer gate TG3 to the floating diffusion region FD.

Referring to FIG. 6D, when the fourth shutter pattern 40_4 is opened and the first to third shutter patterns 40_1 to 40_3 are blocked in the fourth operation cycle, the fourth effective photodiode region PDe4 can generate photoelectrons having the fourth color information obtained by the fourth color filter 50_4. The photoelectrons having the fourth color information may be transferred by the fourth transfer gate TG4 to the floating diffusion region FD.

Figure 10:
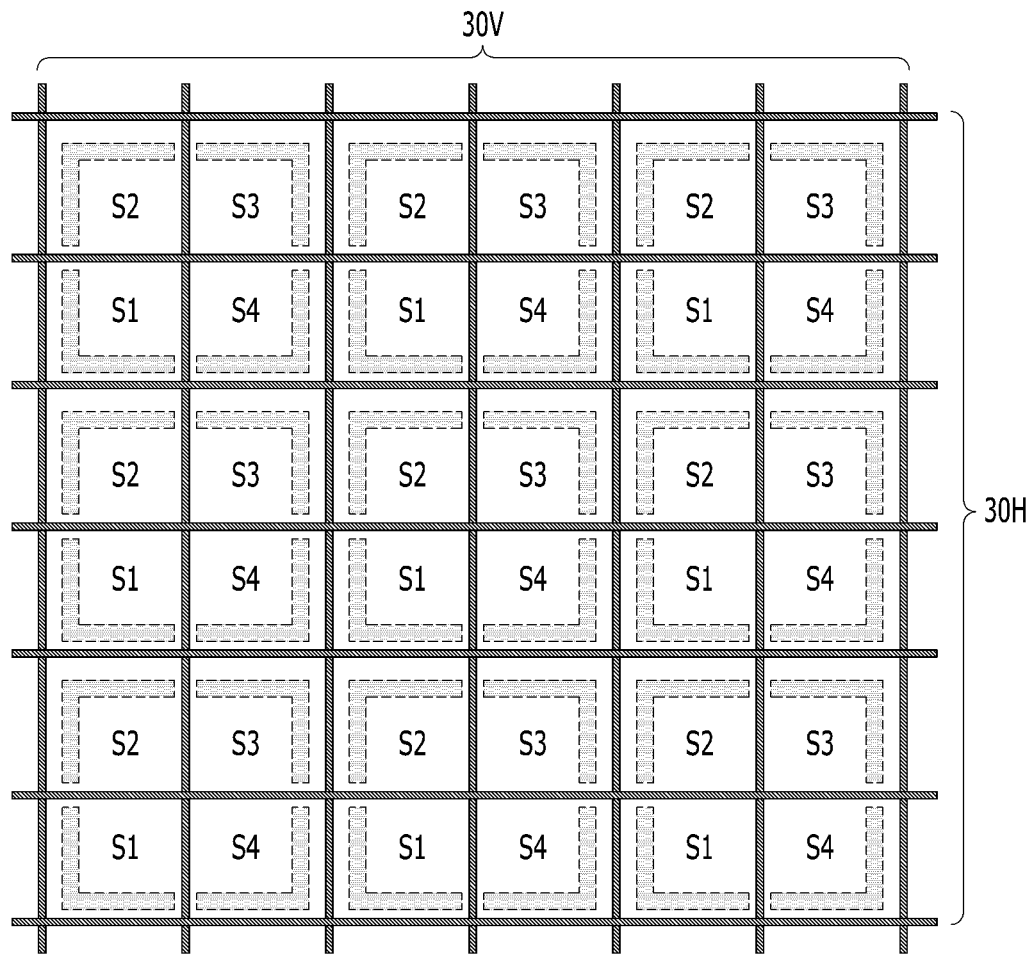
FIG. 10 is a layout of exemplary grid patterns on a lower side of a substrate of the image sensor.

FIG. 10 is an example of a layout of the grid patterns 30 on a lower side of a substrate of the image sensor. To facilitate understanding the disclosed technology, the first to fourth PD bias patterns B1 to B4 are shown together using a dotted line. Referring to FIG. 10, the grid patterns 30 of the image sensor in accordance with the embodiment of the disclosed technology may include vertical grid patterns 30V that extend vertically and spaced apart from one another and horizontal grid patterns 30H that extend horizontally and spaced apart from another, where the vertical grid patterns 30V and the horizontal grid patterns 30H may be orthogonal to each other. The grid patterns 30V and 30H may be disposed on a lower side of the substrate 10 in a mesh form such that each of the vertical gird patterns 30V crosses each of the horizontal grid patterns 30H. The shutter patterns 40_1 to 40_4, the color filters 50_1 to 50_4, and the micro-lenses 60_1 to 60_4 may be stacked on the lower side of the substrate 10. The first to fourth shutter patterns 40_1 to 40_4 and the first to fourth color filters 50_1 to 50_4 shown in FIGS. 6A and 6B may be stacked in the first to fourth cell spaces S1 to S4 defined by the grid patterns 30V and 30H, and the first to fourth micro-lenses 60_1 to 60_4 may be stacked over the grid patterns 30V and 30H, and the first to fourth color filters 50_1 to 50_4. Each of the first to fourth cell spaces S1 to S4 may correspond to one among a red color, a blue color, a first green color, and/or a second green color. The first to fourth spaces S1 to S4 may overlap with the photodiode region PD. In other words, the photodiode region PD may be shared by the first to fourth cell spaces S1 to S4 to receive light in different colors. The first to fourth cell spaces S1 to S4 defined by the grid patterns 30 may be included in the single unit pixel PX which is defined by the pixel isolation patterns 15. Thus, the pixel isolation patterns 15 can define the unit pixel PX, and the grid patterns 30 can define the first to fourth cell spaces S1 to S4 in the one unit pixel PX.

Figure 11A:
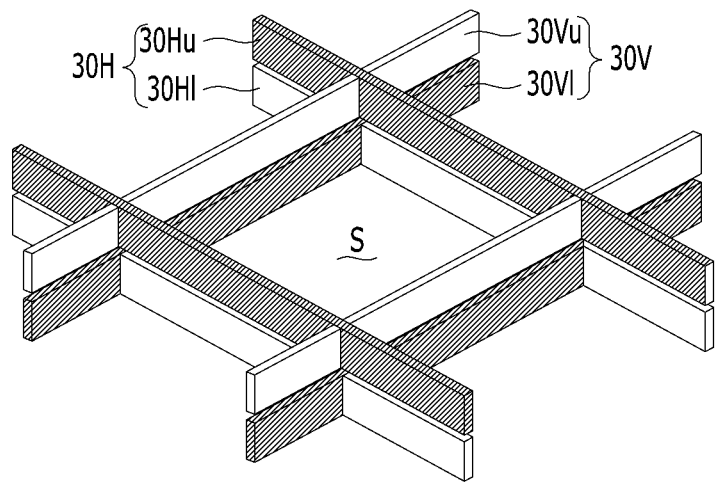
FIGS. 11A and 11B are three-dimensional perspective views of exemplary grid patterns.
Figure 11B:
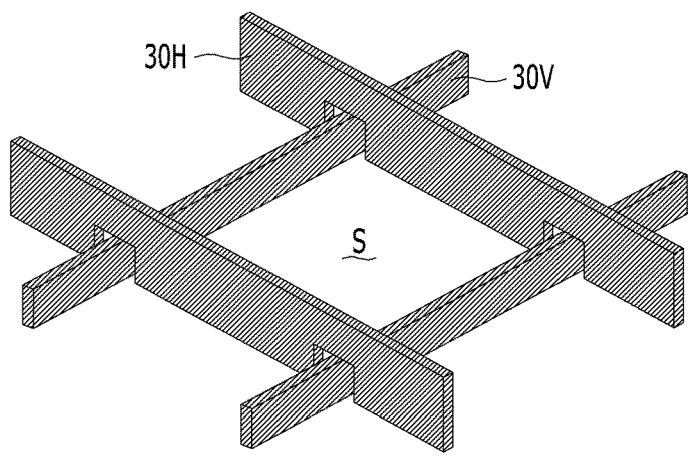

FIGS. 11A and 11B are three-dimensional perspective views of the grid patterns 30V and 30H. Referring to FIG. 11A, the grid patterns 30V and 30H may be formed in two layers. For example, the horizontal grid patterns 30H may include lower horizontal grid patterns 30Hl and upper horizontal grid patterns 30Hu, and the vertical grid patterns 30V may also include lower vertical grid patterns 30Vl and upper vertical grid patterns 30Vu. According to an embodiment of the disclosed technology, the upper horizontal grid patterns 30Hu and the lower vertical grid patterns 30Vl may include a conductor, such as metal, and the lower horizontal grid patterns 30Hl and the upper vertical grid patterns 30Vu may include a non-conductor. In other words, the horizontal grid patterns 30H and the vertical grid patterns 30V may be electrically isolated from each other. Accordingly, the space S may include a lower electric field generated by the lower vertical grid patterns 30Vl that are in parallel and an upper electric field generated by the upper horizontal grid patterns 30Hu that are in parallel. The first to fourth shutter patterns 40_1 to 40_4 of FIGS. 6A and 6B may be opened or blocked by the upper electric field and/or the lower electric field. To be specific, when one among the first to fourth shutter patterns 40_1 to 40_4 is opened, the remaining three among the first to fourth shutter patterns 40_1 to 40_4 may be blocked.

Referring to FIG. 11B, the grid patterns 30V and 30H may include vertical grid patterns 30V which are relatively short in height and horizontal grid patterns 30H which are relatively high in height. The horizontal grid patterns 30H and the vertical grid patterns 30V may be spaced apart from each other to be electrically isolated from each other. In FIGS. 11A and 11B, the relative positions of the horizontal grid pattern 30H and the vertical grid pattern 30V may be reversed.

Figure 12A:
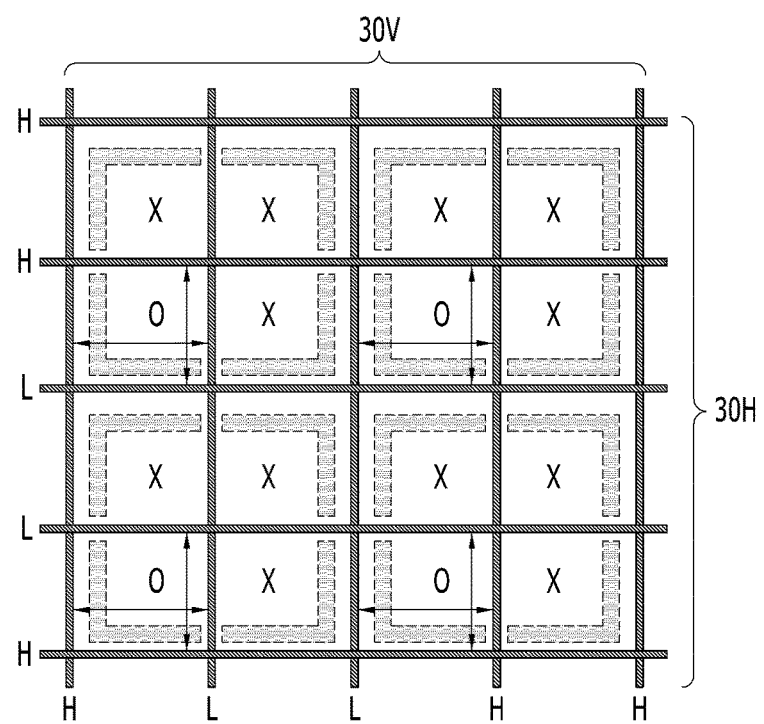
FIGS. 12A to 12D conceptually illustrate voltage conditions for opening or closing first to fourth shutter patterns of an image sensor in accordance with an embodiment of the disclosed technology.
Figure 12B:
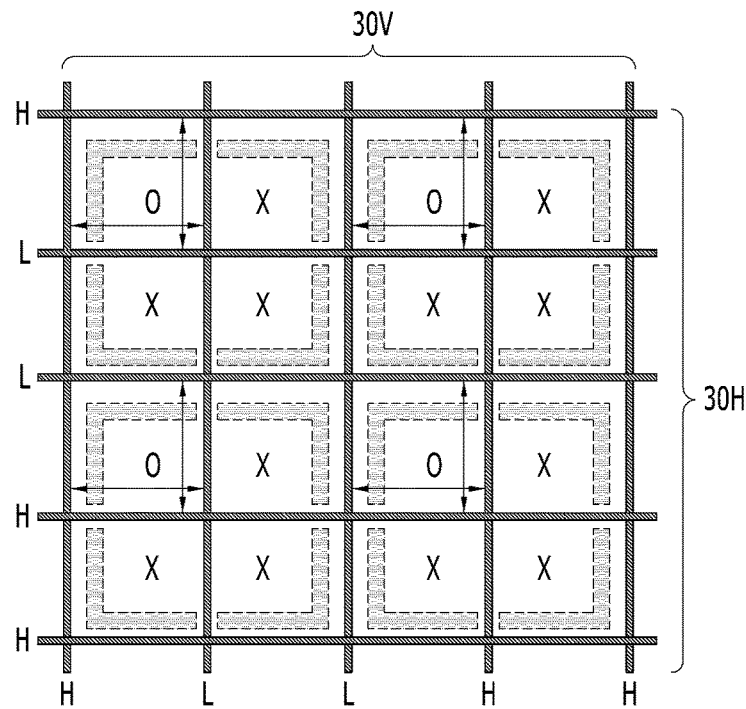
Figure 12C:
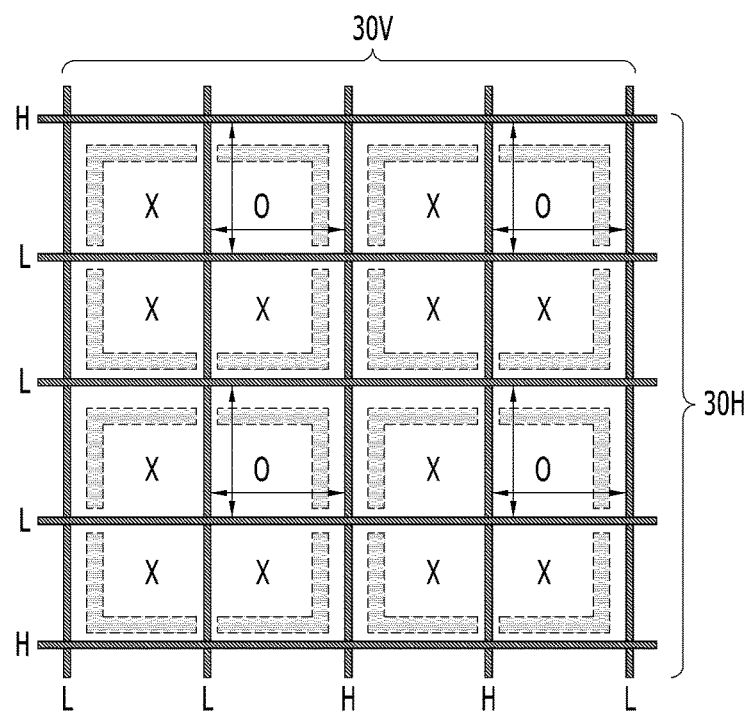
Figure 12D:
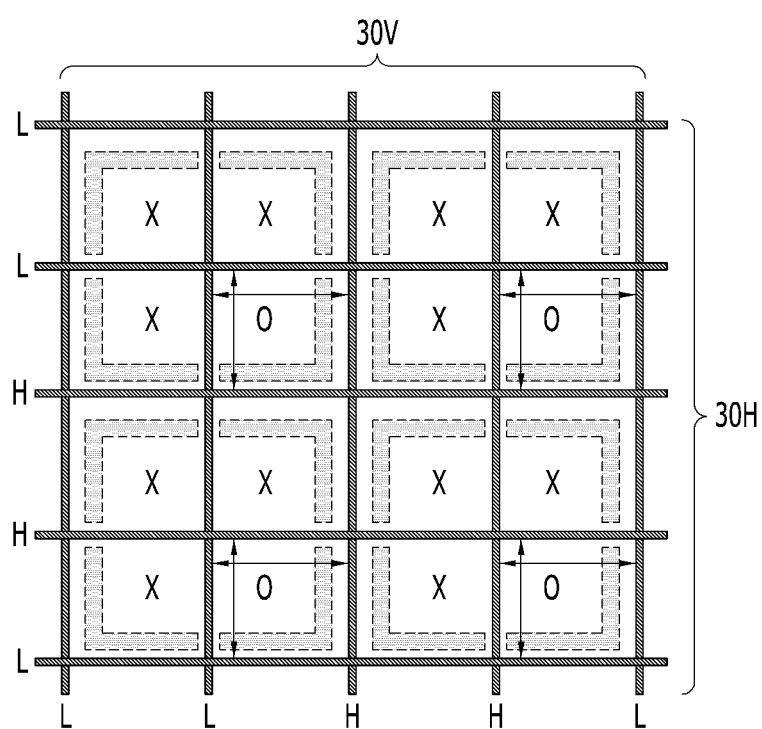

FIGS. 12A to 12D conceptually illustrate voltage conditions for opening or closing first to fourth shutter patterns 40_1 to 40_4 of the image sensor in accordance with an embodiment of the disclosed technology, Referring to FIGS. 12A to 12D, when the neighboring horizontal grid patterns 30H have a horizontal potential difference and the neighboring vertical grid patterns 30V have a vertical potential difference, the shutter patterns 40_n disposed between them may be opened (Cell spaces indicated as 'O'). When any one among the neighboring horizontal grid patterns 30H or the neighboring vertical grid patterns 30V does not have a potential difference, the shutter patterns 40_n disposed between them may be blocked (Cell spaces indicated as 'X'). In other words, only when all the neighboring horizontal grid patterns 30H and all the neighboring vertical grid patterns 30V have potential differences, the shutter pattern 40_n may be opened. In FIGS. 12A to 12D, a relatively high potential is indicated as 'H', and a relatively low potential is indicated as 'L'. The 'H' and 'L' may be interchangeable. For example, in FIG. 12A, when the first to fifth horizontal grid patterns 30H are located from the top to the bottom, there exists a horizontal potential difference between the second horizontal grid pattern 30H and the third horizontal grid pattern 30H and between the fourth horizontal grid pattern 30H and fifth horizontal gird pattern 30H. In the example of FIG. 12A, when the first to fifth vertical grid patterns 30V are located from the left to the right, there exists a vertical potential difference between the first vertical grid pattern 30V and the second vertical grid pattern 30V and between the third vertical grid pattern 30V and the fourth vertical grid pattern 30V. Thus, in FIG. 12A, the shutter patterns disposed in the cell spaces S1 in FIG. 10 are opened. FIG. 12B to 12D also show implementations of the opening/closing of the shutter patterns of the image sensor based on the potential differences of the grid patterns.

Figure 13:
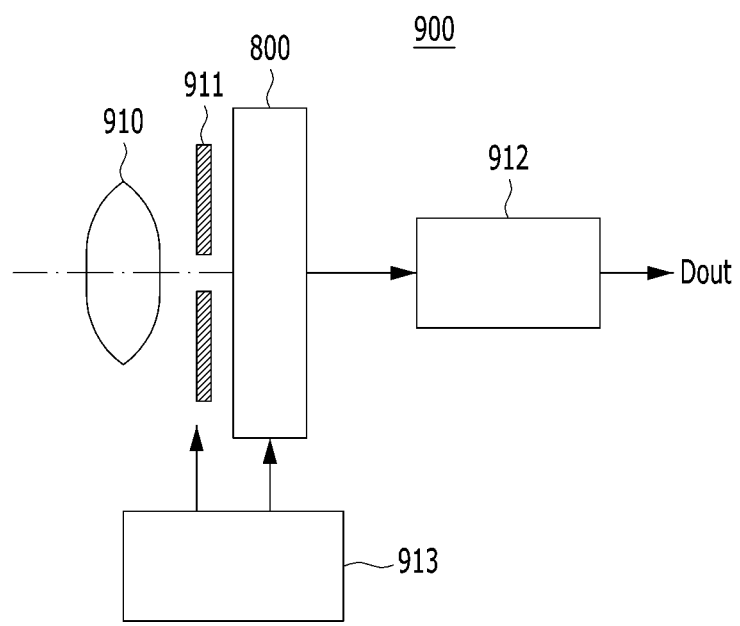
FIG. 13 is a conceptual diagram illustrating an electronic device having an image sensor in accordance with an embodiment of the disclosed technology.

FIG. 13 is a conceptual diagram illustrating an electronic device 900 having an image sensor in accordance with an embodiment of the disclosed technology. Referring to FIG. 13, the electronic device 900 including the image sensor in accordance with the embodiment of the disclosed technology may include a camera capable of taking a still image or a moving picture. The electronic device 900 may include an optical system 910 (or an optical lens), a shutter unit 911, the image sensor 800, and a controller 913 for controlling/driving the image sensor 800 and the shutter unit 911, and a signal processor 912. The image sensor 800 may be an image sensor in accordance with the various embodiments of the disclosed technology.

The optical system 910 can guide optical image (incident light) from a subject to a pixel array (refer to a reference numeral "810" of FIG. 1) of the image sensor 100. The optical system 910 may include a plurality of optical lenses. The shutter unit 911 can control the length of time that the image sensor 100 is exposed to light and shut off from the light. The controller 913 can control a transfer operation of the image sensor 800 and a shutter operation of the shutter unit 911. The signal processor 912 can process diverse kinds of signals outputted from the image sensor 800. Image signals Dout outputted after the signal processing may be stored in a storage medium, such as a memory, or outputted to a monitor.

According to the embodiments of the disclosed technology, since an image sensor is capable of receiving light in different colors by using one photodiode region, the light receiving capability and the photoelectron generating capability of the photodiode region may be improved.

According to the embodiments of the disclosed technology, the photodiode regions of the image sensor is designed to have different effective photodiode regions that can be changed appropriately for receiving the light in different colors according to the voltage applied thereto.

According to the embodiments of the disclosed technology, since the image sensor includes pixel isolation patterns that block off a photoelectron leakage path, the efficiency of the photoelectrons generated in an effective photodiode region can be maintained without a decrease.

Other effects of the diverse embodiments of the disclosed technology that are not described herein may be understood from the detailed description of the disclosed technology.

While the disclosed technology has been described with respect to the specific embodiments it will be apparent to those skilled in the art that various changes and modifications may be made.

What is claimed is:
1. An image sensor, comprising:
a photosensing region in a substrate and configured to generate photoelectrons in response to an incident light on the photodiode region;
four conductive bias patterns disposed on first to fourth quadrants of the photosensing region, respectively, and surrounding the photosensing region, each of the four conductive bias patterns physically spaced apart from one another and having an elbow shape in a top view; and
pixel isolation patterns that are spaced apart from the four conductive bias patterns and surround the four conductive bias patterns.
2. The image sensor of claim 1, wherein the four conductive bias patterns include:
a lining insulating layer which is formed on inner walls of trenches formed in the substrate, and
a conductor which fills the trenches over the lining insulating layer.
3. The image sensor of claim 1, wherein each of the four conductive bias patterns includes a pad region to which a voltage is applied.
4. The image sensor of claim 1, wherein the pixel isolation patterns are formed in a shape of a partition wall extending from a bottom surface of the substrate toward an upper surface of the substrate.
5. The image sensor of claim 1, wherein the pixel isolation patterns include vertical lines and horizontal lines that are orthogonal to each other in a top view, and the pixel isolation patterns are disposed in a mesh form that the vertical lines and the horizontal lines are connected.
6. The image sensor of claim 1, further comprising:
a floating diffusion region disposed in a center of the photosensing region;
a floating diffusion isolation region configured to surround the floating diffusion region; and
transfer gates that vertically overlap with portions of the floating diffusion region and the floating diffusion isolation region and structured to be operable to transfer photoelectrons generated in the photosensing region out of the photosensing region.
7. The image sensor of claim 1, further comprising:
grid patterns vertically overlapping with a central portion of the photosensing region and the pixel isolation patterns and providing cell spaces in a unit pixel provided by the pixel isolation patterns.
8. The image sensor of claim 7, further comprising:
shutter patterns disposed to correspond to the four conductive bias patterns, respectively; and
color filters disposed over the shutter patterns, respectively, and wherein the shutter patterns and the color filters are disposed in the cell spaces, respectively, wherein the shutter patterns include at least one of a polarizing filter or a liquid crystal display (LCD).

9. An image sensor, comprising:

a plurality of unit pixels that are disposed in rows and columns; and pixel isolation patterns that are formed in the substrate and spaces between the unit pixels, wherein each of the unit pixels includes:

a single photodiode region formed in a substrate;

first to fourth photodiode (PD) bias patterns that are formed in the substrate to be physically spaced apart from one another, the first to fourth PD bias patterns disposed on virtual first to fourth quadrants of a corresponding pixel unit to surround the single photodiode region and including a conductive material; and grid patterns formed on a first side of the substrate to divide the single photodiode region into first to fourth cell spaces over the virtual first to fourth quadrants, the grid patterns having a mesh shape with horizontal portions and vertical portions, wherein the pixel isolation patterns surround the single photodiode region, the pixel isolation patterns are disposed between adjacent PD bias patterns of adjacent unit pixels.

10. The image sensor of claim 9, wherein the pixel isolation patterns are formed in a shape of a partition wall extending from a second side of the substrate into an inside of the substrate.

11. The image sensor of claim 9, further comprising:

a floating diffusion region disposed in a center of the single photodiode region;

a floating diffusion isolation region configured to surround the floating diffusion region; and first to fourth transfer gates that partially overlap with a portion of the floating diffusion region and disposed on the first to fourth quadrants, wherein the first to fourth transfer gates are disposed over the single photodiode region.

12. The image sensor of claim 9, wherein the first to fourth PD bias patterns include:

a lining insulating layer which is formed on inner walls of trenches extending from an upper side of the substrate into inside of the substrate, and a conductor which fills the trenches over the lining insulating layer.

13. The image sensor of claim 9, wherein the first to fourth PD bias patterns include first to fourth pad regions, respectively, the first to fourth pad regions contacting a contact plug.

14. The image sensor of claim 9, wherein some portions of the grid patterns vertically overlaps with a central portion of the photodiode region and the pixel isolation patterns and provides first to fourth cell spaces in each unit pixel provided by the pixel isolation patterns surrounding the single photodiode region.

15. The image sensor of claim 14, further comprising:

first to fourth shutter patterns disposed to correspond to the first to fourth PD bias patterns, respectively; and first to fourth color filters disposed over the first to fourth shutter patterns, respectively, and wherein the first to fourth shutter patterns and the first to fourth color filters are disposed in the first to fourth cell spaces, respectively, and wherein the first to fourth shutter patterns include one of a polarizing filter or a liquid crystal display (LCD).

16. An image sensor, comprising:

a plurality of unit pixels and pixel isolation patterns, wherein each of the unit pixels includes:

one photodiode region;

a floating diffusion region disposed in a center of the photodiode region;

first to fourth transfer gates that are disposed on first to fourth quadrants of the photodiode region to overlap with the floating diffusion region, and first to fourth PD bias patterns that are spaced apart from one another to surround the photodiode region, wherein the pixel isolation patterns are disposed to surround the first to fourth PD bias patterns to define a boundary of each of the unit pixels, wherein each the first to fourth PD bias patterns includes:

a lining insulating layer which is formed on inner walls of trenches extending from an upper side of the substrate into inside of the substrate, and a conductor which fills the trenches over the lining insulating layer.

17. The image sensor of claim 16, further comprising grid patterns configured to divide the photodiode region into first to fourth cell spaces corresponding to the first to fourth transfer gates.

18. The image sensor of claim 1, wherein the four conductive bias patterns are physically separated from one another.

19. The image sensor of claim 16, wherein the shutter patterns include one of a polarizing filter or a liquid crystal display (LCD).

20. The image sensor of claim 16, wherein:

the pixel isolation patterns surround the photodiode region, and the pixel isolation patterns are disposed between adjacent PD bias patterns of the adjacent pixel units.

* * * * *